United States Patent
Aggarwal et al.

(10) Patent No.: US 12,493,155 B2
(45) Date of Patent: Dec. 9, 2025

(54) PRESERVING ACCESS TO OPTICAL COMPONENTS ON A WAFER PACKAGE WITH SACRIFICIAL CAP

(71) Applicant: Celestial AI Inc., Santa Clara, CA (US)

(72) Inventors: Ankur Aggarwal, Pleasanton, CA (US);
Anmol Rathi, San Jose, CA (US);
Suresh Venkata Pothukuchi, Chandler, AZ (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/170,645

(22) Filed: Apr. 4, 2025

(65) Prior Publication Data
US 2025/0370203 A1     Dec. 4, 2025

Related U.S. Application Data

(60) Provisional application No. 63/694,684, filed on Sep. 13, 2024, provisional application No. 63/655,461, filed on Jun. 3, 2024.

(51) Int. Cl.
| | |
|---|---|
| G02B 6/42 | (2006.01) |
| G02B 6/43 | (2006.01) |
| H01L 25/16 | (2023.01) |
| H01L 23/00 | (2006.01) |

(52) U.S. Cl.
CPC ......... *G02B 6/4255* (2013.01); *G02B 6/4246* (2013.01); *G02B 6/4256* (2013.01); *G02B 6/4292* (2013.01); *G02B 6/43* (2013.01); *H01L 25/167* (2013.01); *H01L 24/08* (2013.01)

(58) Field of Classification Search
CPC .. G02B 6/4255; G02B 6/4246; G02B 6/4256; G02B 6/4292; G02B 6/43; H01L 25/167; H01L 24/08
See application file for complete search history.

(56) References Cited

U.S. PATENT DOCUMENTS

| | | |
|---|---|---|
| 7,778,501 B2 | 8/2010 | Beausoleil et al. |
| 7,889,996 B2 | 2/2011 | Zheng et al. |
| 7,961,990 B2 | 6/2011 | Krishnamoorthy et al. |
| 8,064,739 B2 | 11/2011 | Binkert et al. |

(Continued)

FOREIGN PATENT DOCUMENTS

| | | |
|---|---|---|
| CN | 106980160 A | 7/2017 |
| WO | WO2023177417 | 9/2022 |

(Continued)

OTHER PUBLICATIONS

U.S. Appl. No. 17/807,692, filed Jun. 17, 2022, Winterbottom et al.

(Continued)

*Primary Examiner* — Michael P Mooney
(74) *Attorney, Agent, or Firm* — Ray Quinney & Nebeker P.C.; James S. Bullough

(57) ABSTRACT

The present disclosure relates to packaging techniques in connection with packaging electrical and optical components within circuit packages. For example, one or more examples described herein involve techniques for packaging an electro-photonic circuit while preserving access to a grating coupler, which may involve using a sacrificial cap in conjunction with a unique overmolding process.

27 Claims, 16 Drawing Sheets

(56) References Cited

U.S. PATENT DOCUMENTS

| | | |
|---|---|---|
| 8,237,278 B2 | 8/2012 | Gluschenkov et al. |
| 9,495,295 B1 | 11/2016 | Dutt et al. |
| 9,791,761 B1 | 10/2017 | Li et al. |
| 9,831,360 B2 | 11/2017 | Knights et al. |
| 10,168,475 B2 | 1/2019 | Parker et al. |
| 10,852,492 B1 | 12/2020 | Vermeulen et al. |
| 10,962,728 B2 | 3/2021 | Nelson et al. |
| 10,976,491 B2 | 4/2021 | Coolbaugh et al. |
| 11,107,770 B1 | 8/2021 | Ramalingam et al. |
| 11,222,867 B1* | 1/2022 | Huang ............ H01L 24/08 |
| 11,233,580 B2 | 1/2022 | Meade et al. |
| 11,336,376 B1 | 5/2022 | Xie |
| 11,493,714 B1 | 11/2022 | Mendoza et al. |
| 11,500,153 B2 | 11/2022 | Meade et al. |
| 11,509,397 B2 | 11/2022 | Ma et al. |
| 11,817,903 B2 | 11/2023 | Pleros et al. |
| 11,837,509 B1 | 12/2023 | Chou et al. |
| 12,055,766 B2 | 8/2024 | Pupalaikis et al. |
| 12,148,742 B2 | 11/2024 | Liljeberg et al. |
| 12,191,257 B2 | 1/2025 | Aggarwal |
| 2011/0206379 A1 | 8/2011 | Budd |
| 2015/0354938 A1 | 12/2015 | Mower et al. |
| 2016/0116688 A1 | 4/2016 | Hochberg et al. |
| 2017/0045697 A1 | 2/2017 | Hochberg et al. |
| 2017/0115458 A1 | 4/2017 | Mekis et al. |
| 2017/0194309 A1 | 7/2017 | Evans et al. |
| 2017/0207600 A1 | 7/2017 | Klamkin et al. |
| 2017/0237226 A1 | 8/2017 | Johnson et al. |
| 2017/0261693 A1 | 9/2017 | Gambino et al. |
| 2017/0261708 A1 | 9/2017 | Ding et al. |
| 2019/0049665 A1 | 2/2019 | Ma et al. |
| 2019/0067037 A1 | 2/2019 | Pelletier et al. |
| 2019/0205737 A1 | 7/2019 | Bleiweiss et al. |
| 2019/0265408 A1 | 8/2019 | Ji et al. |
| 2019/0317285 A1 | 10/2019 | Liff |
| 2019/0317287 A1 | 10/2019 | Raghunathan et al. |
| 2020/0006304 A1 | 1/2020 | Chang et al. |
| 2020/0142441 A1 | 5/2020 | Bunandar et al. |
| 2020/0158967 A1 | 5/2020 | Winzer et al. |
| 2020/0200987 A1 | 6/2020 | Kim |
| 2020/0203309 A1 | 6/2020 | Beyne |
| 2020/0250532 A1 | 8/2020 | Shen et al. |
| 2020/0284981 A1 | 9/2020 | Harris et al. |
| 2021/0064958 A1 | 3/2021 | Lin et al. |
| 2021/0132309 A1 | 5/2021 | Zhang et al. |
| 2021/0247569 A1 | 8/2021 | Traverso et al. |
| 2021/0257396 A1 | 8/2021 | Piggott et al. |
| 2021/0266200 A1 | 8/2021 | Yang |
| 2021/0271020 A1 | 9/2021 | Islam et al. |
| 2021/0286129 A1 | 9/2021 | Fini et al. |
| 2022/0091332 A1 | 3/2022 | Yoo et al. |
| 2022/0159860 A1 | 5/2022 | Winzer et al. |
| 2022/0171142 A1 | 6/2022 | Wright et al. |
| 2022/0328395 A1 | 10/2022 | Chen et al. |
| 2022/0342150 A1 | 10/2022 | Karhade et al. |
| 2022/0342164 A1 | 10/2022 | Chen et al. |
| 2022/0374575 A1 | 11/2022 | Ramey et al. |
| 2022/0382005 A1 | 12/2022 | Rusu |
| 2023/0088009 A1 | 3/2023 | Karhade et al. |
| 2023/0197699 A1 | 6/2023 | Spreitzer et al. |
| 2023/0258881 A1 | 8/2023 | Weng et al. |
| 2023/0258886 A1 | 8/2023 | Liao |
| 2023/0308188 A1 | 9/2023 | Dorta-Quinones |
| 2023/0314702 A1 | 10/2023 | Yu |
| 2023/0352464 A1 | 11/2023 | Damaraju et al. |
| 2023/0376818 A1 | 11/2023 | Nowak |
| 2023/0393357 A1 | 12/2023 | Ranno |
| 2023/0395443 A1 | 12/2023 | Lai et al. |
| 2024/0030065 A1 | 1/2024 | Duan et al. |
| 2024/0030147 A1 | 1/2024 | Duan et al. |
| 2024/0030204 A1 | 1/2024 | Duan et al. |
| 2024/0036254 A1 | 2/2024 | Winzer et al. |
| 2024/0097796 A1 | 3/2024 | Winzer et al. |
| 2024/0272385 A1 | 8/2024 | Chen et al. |
| 2025/0062258 A1 | 2/2025 | Kannan et al. |
| 2025/0167187 A1 | 5/2025 | Yu et al. |
| 2025/0201793 A1 | 6/2025 | Suthram et al. |
| 2025/0216629 A1 | 7/2025 | Psaila et al. |

FOREIGN PATENT DOCUMENTS

| | | |
|---|---|---|
| WO | WO2022266676 | 12/2022 |
| WO | WO2023177922 | 9/2023 |

OTHER PUBLICATIONS

U.S. Appl. No. 18/293,673, filed Oct. 17, 2024, Bos et al.

Agrawal, Govind; "Chapter 4—Optical Receivers", Fiber-Optic Communications Systems, John Wiley & Sons, Inc., (2002), pp. 133-182.

Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.

Eltes, Felix et al.; Low-Loss BaTiO3—Si Waveguides for Nonlinear Integrated Photonics; ACS Photon., vol. 3, No. 9; (2016), pp. 1698-1703.

Harris, NC et al.; "Efficient, compact and low loss thermo-optic phase shifter in colicon"; Opt. Express, vol. 22, No. 9; (2014), pp. 10487-10493.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Miller, David A. et al; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.

Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.

Zhang, Yulong; "Building blocks of a silicon photonic integrated wavelength division multiplexing transmitter for detector instrumentation", Doktors Der Ingenieurwissenschaften (Dr. -Ing. ), Dec. 15, 2020 (Dec. 15, 2020), 128 pages.

"International Search Report and Written Opinion issued in PCT Application No. PCT/US2025/031959", Mail Date: Sep. 16, 2026, 17 pages.

* cited by examiner

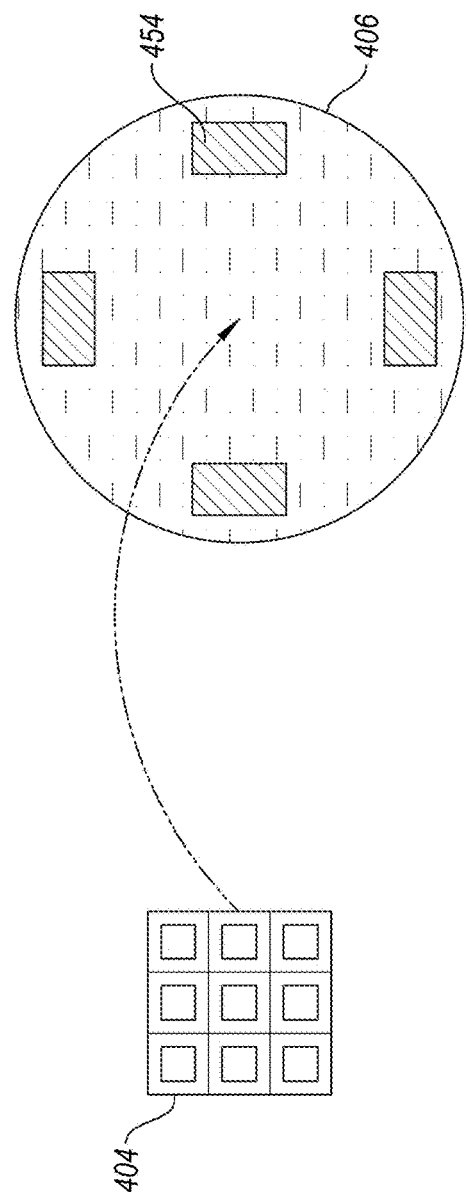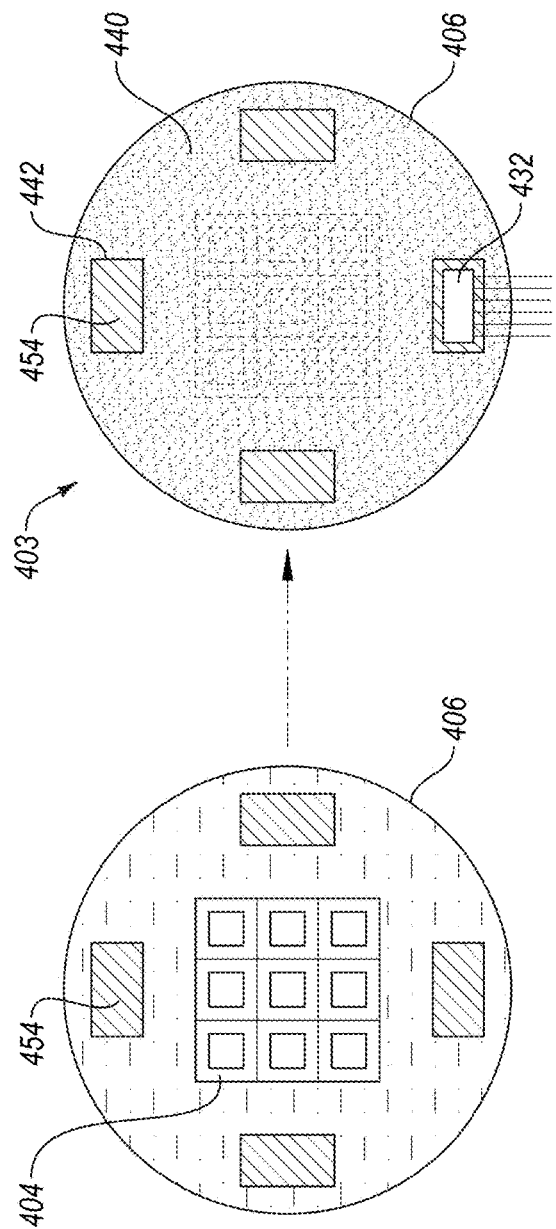

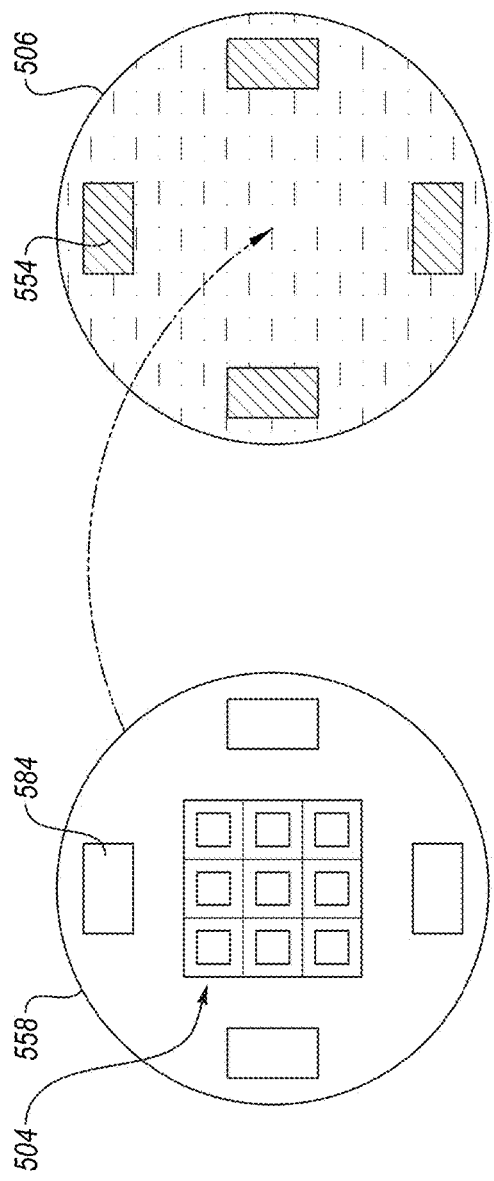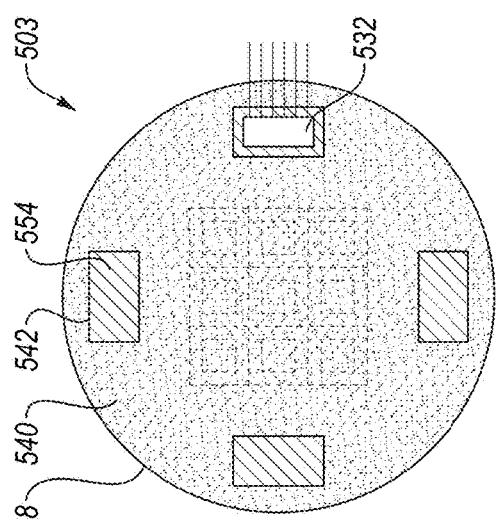
FIG. 5A
FIG. 5B

PRESERVING ACCESS TO OPTICAL COMPONENTS ON A WAFER PACKAGE WITH SACRIFICIAL CAP

CROSS-REFERENCE TO RELATED APPLICATIONS

This application claims priority to U.S. Provisional Patent Application No. 63/655,461, entitled "PACKAGING OPTICALLY ACCESSIBLE COMPONENTS", filed on Jun. 3, 2024, the entirety of which is incorporated herein by reference. This application also claims priority to U.S. Provisional Patent Application No. 63/694,684, entitled "PACKAGING OPTICAL COMPONENTS," filed on Sep. 13, 2024, the entirety of which is incorporated herein by reference.

BACKGROUND OF THE DISCLOSURE

The subject matter discussed in this section should not be assumed to be prior art merely as a result of inclusion in this section. Similarly, any problems mentioned in this section or associated with subject matter provided as background should not be construed as an admission of prior art.

Integrated circuits (ICs) with processors, especially those for executing artificial intelligence and machine learning functions, move large amounts of data among one or more processor ICs and one or more memory ICs. Chiplets may aid in the interconnection of processor dies, memory dies, and other circuits to increase the bandwidth and decrease latency and power dissipated in the process. In the event that these interconnections utilize optical elements, maintaining optical pathways through the hardware of a circuit package can become a challenge and present difficulties, particularly in manufacturing and implementing IC architectures.

BRIEF DESCRIPTION OF THE DRAWINGS

FIGS. 4A-4C illustrate an example implementation related to packaging a wafer package and maintaining an optical window thereon, according to at least one embodiment of the present disclosure.

FIGS. 5A and 5B show an example implementation in which an electronic integrated circuit (EIC) wafer is bonded to a photonic integrated circuit (PIC) wafer, according to at least one embodiment of the present disclosure.

DETAILED DESCRIPTION

Figure 1:
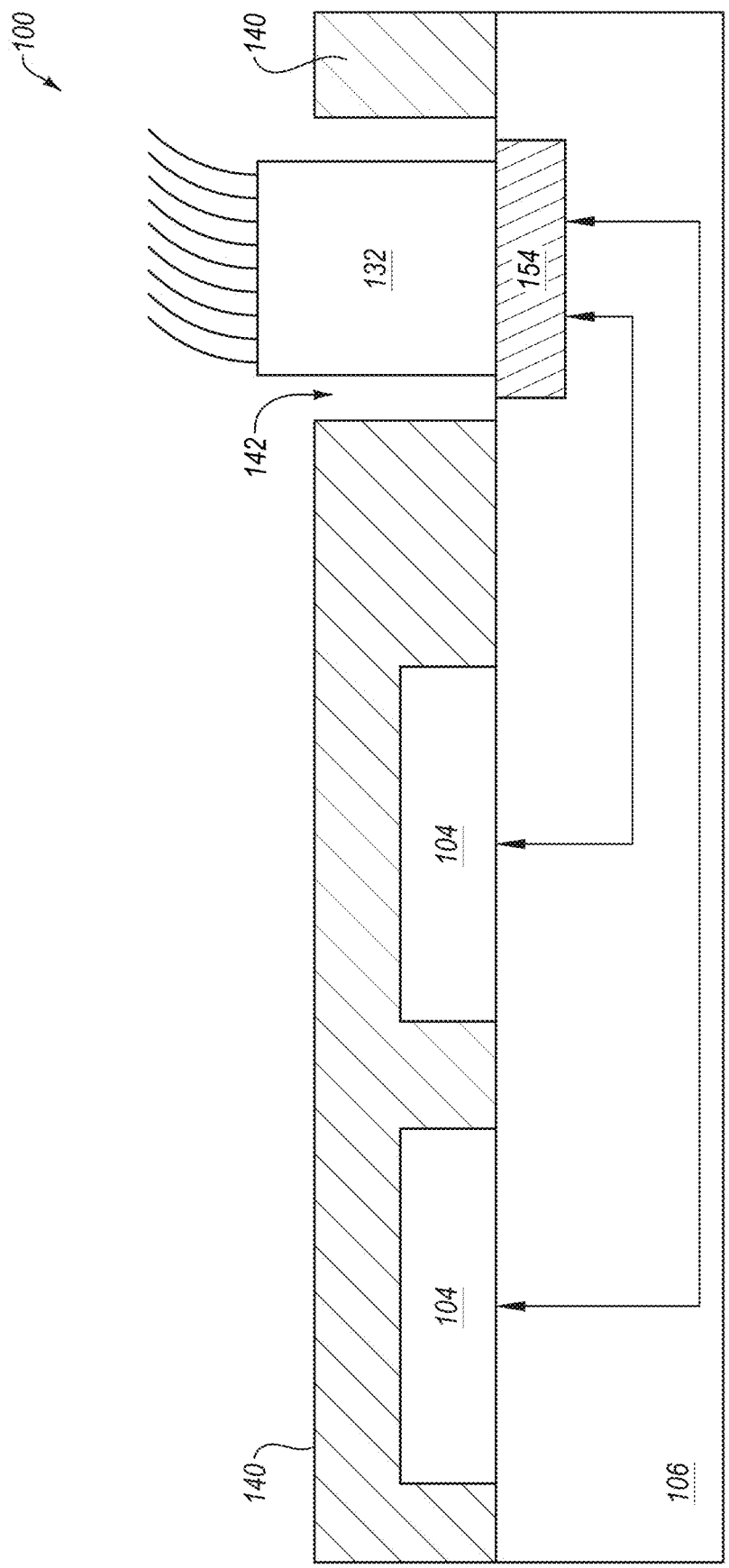
FIG. 1 illustrates an example of a circuit package being configured for connecting to one or more external devices, according to at least one embodiment of the present disclosure.

The present disclosure relates to example implementations of photonic circuit packages. Indeed, implementations herein relate to facilitating connectivity to waveguides and/or optical fibers coupled to optical regions by providing accessibility to such components at or through a surface of a molded circuit package. For instance, where a photonic circuit package may be covered or molded with an overmold—such as to maintain mechanical integrity of a substrate and/or to secure components thereto—the present techniques facilitate providing an optical window or void through the overmold for the purpose of providing a photonic path to one or more photonic interfaces disposed below a surface of the overmold. For example, one or more particular examples described herein relate to providing an optical window through an overmold for access to a grating coupler region when producing a molded circuit package.

Photonic circuit packages, and more specifically electrophonic circuit packages, can be used in an artificial intelligence (AI) accelerator, a bridge, a chiplet, or any other configuration that can benefit from photonic links on and off the package or within the package. For example, electrophotonic circuit packages may include electronic components, such as processing components, memory components and the like which operate in an electronic domain, as well as photonic components for communicating data via photonic signals in a photonic domain.

One or more embodiments of the present disclosure relate to a circuit package (or wafer package) having features and functionality in accordance with one or more examples described and illustrated herein. For example, one or more embodiments relate to a circuit package. As will be discussed in further detail below, the resulting circuit package may include a variety of features and functionalities related to providing or preserving access to optical components on a wafer package, such as a GC region or other optical region(s) near a top surface of a wafer.

In one or more embodiments, a circuit package includes a wafer having an optical region designed to allow light to exit or enter from a top surface of the wafer and having a plurality of first electrical connections on the top surface of the wafer which do not overlap with the optical region. The wafer may include a first portion of an electro-photonic transceiver optically coupled to the optical region (or to multiple optical regions). The circuit package may additionally include one or more electronic components having a plurality of second electrical connections on a bottom surface thereof, and being positioned on the top surface of the wafer such that there are electrical couplings between the plurality of first electrical connections and the plurality of second electrical connections. The one or more electronic components may have a second portion of the electro-photonic transceiver connected to the first portion of the electro-photonic transceiver via the electrical couplings. The circuit package may further include an overmold layer, including overmold deposited over a portion of the wafer and the one or more electrical components and a portion of a sacrificial cap positioned around the optical region and forming a void within the overmold layer above the optical region and extending toward a top surface of the overmold.

In one or more embodiments, the void provides an optical path from a top surface of the circuit package to the top surface of the wafer near the optical region. In one or more embodiments, walls around the interior of the void are made from a molding material of the sacrificial cap placed over the optical region prior to depositing the overmold over the portion of the wafer and the one or more electronic components. In one or more embodiments, the molding material of the sacrificial cap is made from a same material as the overmold deposited over the portion of the wafer and the one or more electrical components. In one or more embodiments, the molding material is made from a different material as the overmold deposited over the portion of the wafer and the one or more electrical components.

In one or more embodiments, the electro-optical transceiver includes a driver connected to a modulator in the first portion, a transimpedance amplifier (TIA) connected to a photodiode in the first portion, a serializer in the second portion that provides an output to the driver, and a deserializer in the second portion that receives an input from the TIA. In one or more embodiments, one or more of the driver and the TIA is in the first portion of the electro-optical transceiver. In one or more embodiments, the driver is selected from the group consisting of an electro-absorption modulator (EAM), a micro-ring resonator, a ring modulator, a Mach-Zender interferometer (MZI), and a quantum confined stark effect (QCSE) electro-absorptive modulator.

In one or more embodiments, prior to grinding down a top surface of the overmold layer, placement of the sacrificial cap over the optical region prevents the overmold from flowing in an area of the void over the top surface of the wafer at a location of the optical region. In one or more embodiments, a depth of the void is less than 1000 microns. In one or more embodiments, a cross-section of the void is approximately a same size and shape as a size and shape of the top surface of the wafer over the optical region.

In one or more embodiments, the circuit package includes an optical interface component that aligns a plurality of optical fibers with the optical region such that optical signals can pass between waveguides formed in the wafer and the plurality of optical fibers. In one or more embodiments, the optical interface component is a fiber array unit (FAU). In one or more embodiments, the one or more electronic components include one or more of a processor component, a memory component, or an analog mixed signal (AMS) block. In one or more embodiments, the wafer includes waveguides formed within the wafer and passing between the region and optical transmitter and receiver portions of the wafer.

As another example, one or more embodiments of the circuit package may include a photonic integrated circuit (PIC) wafer. The PIC wafer may include a region near a top surface of the PIC wafer configured to allow light to enter or exit the PIC wafer and optical transmitter and receiver portions in optical communication with the region, the optical transmitter and receiver portions having electrical interconnects to the top surface of the PIC wafer. The circuit package may further include an EIC layer. The EIC layer may include one or more electronic components disposed on the top surface of the PIC wafer outside of the region including electrical transmitter and receiver portions interconnected via the electrical interconnects with the optical transmitter and receiver portions forming electro-optical paths to and from the one or more electronic components to the region. In one or more embodiments, the circuit package includes an overmold layer, which may include overmold deposited over a portion of the PIC wafer and the one or more electronic components and a sidewall positioned around the region and forming a void within the overmold layer above the region and extending toward a top surface of the overmold.

In one or more embodiments, the void provides an optical path from a top surface of the circuit package to the top surface of the PIC wafer near the region. In one or more embodiments, the sidewall around the interior of the void is made from a first material (e.g., a molding material) of a sacrificial cap placed over the region prior to depositing the overmold over the portion of the PIC wafer and the one or more electronic components. In one or more embodiments, the molding material of the sacrificial cap is made from a same material as the overmold deposited over the portion of the PIC wafer and the one or more electrical components. In one or more embodiments, the molding material of the sacrificial cap is made from a different material as the overmold.

In one or more embodiments, the circuit package includes a driver connected to a modulator in the PIC wafer, a transimpedance amplifier (TIA) connected to a photodiode in the PIC wafer, a serializer in the EIC layer that provides an output to the driver, and a deserializer in the EIC layer that receives an input from the TIA. In one or more embodiments, one or more of the driver and the TIA is in the PIC wafer. In one or more embodiments, the driver is selected from the group consisting of an electro-absorption modulator (EAM), a micro-ring resonator, a ring modulator, a Mach-Zender interferometer (MZI), and a quantum confined stark effect (QCSE) electro-absorptive modulator.

In one or more embodiments, prior to grinding down a top surface of the overmold layer, placement of the sacrificial cap over the region prevents the overmold from flowing in an area of the void over the top surface of the PIC wafer at a location of the region. In one or more embodiments, a depth of the void is less than 1000 microns. In one or more embodiments, a cross-section of the void is approximately a same size and shape as a size and shape of the top surface of the PIC wafer over the region.

In one or more embodiments, a cross-section of the void has an area within which the region fits such that an optical interface component can be positioned within the void and couple one or more optical fibers with a grating coupler in the region. In one or more embodiments, the optical interface component is a fiber array unit (FAU). In one or more embodiments, the one or more electronic components include one or more of a processor component, a memory component, or an analog mixed signal (AMS) block. In one or more embodiments, the PIC wafer includes waveguides formed within the PIC wafer and passing between the region and optical transmitter and receiver portions of the PIC wafer.

Additional features of the methods and devices described herein will be discussed in connection with example illustrations. For example, FIG. 1 illustrates an example of a circuit package 100 being configured for connecting to one or more external devices, according to at least one embodiment of the present disclosure. The circuit package 100 may include a substrate 106 having one or more dies 104 disposed thereon. The substrate 106 may be a photonic integrated circuit (PIC) or PIC wafer, and the dies 104 may be electronic integrated circuit (EIC) dies as described herein. More details regarding wafers, PICs, EICs, dies, the connection therebetween, and various features and functionalities thereof is shown and described below in connection with FIGS. 8A-10C.

In addition to the dies 104 being disposed on the substrate 106, an optical region 154 may be positioned within the substrate 106. For example, the optical region 154 may refer to a grating coupler (GC) region, and may be positioned at or near a top surface of the substrate. In some cases, the optical region 154 is a region at or near the top surface of the substrate 106 through which light may pass (e.g., photonic or optical signals), enabling optical fibers to be coupled to the dies 104 via photonic paths 180 (e.g., waveguides) at least partially formed in the substrate 106. In one or more embodiments, the optical region 154 refers to a region at or near the surface of the substrate 106 that allows light to enter or exit the top surface of the substrate 106. In at least one embodiment, photonic signals are transmitted to and/or from the dies 104 through the photonic paths and by way of the optical region 154 and via a fiber array unit (FAU) 122, which may be connected (via optical fibers) to one or more external devices. In this way, the optical region 154 may facilitate communication with the dies 104 via waveguides that are formed in the substrate 106. Additional information about optical regions, GC, optical interface components, and other features discussed above are shown and described below in connection with FIGS. 8A-10c.

The circuit package 100 may be processed or manufactured to include an overmold 140 which may cover the various components exposed at the surface of the substrate 106 and which secures these components in place relative to the substrate 106. The resulting molded circuit package may include the substrate 106 and dies 104 covered and/or surrounded by the overmold 140, which provides mechanical integrity for the molded circuit package and ensures that the dies 104 remain physically and electrically connected to the substrate, among other beneficial functions. Because the optical region is disposed or formed within the substrate 106, for instance, at or below a surface of the substrate 106, by disposing the overmold 140 on the substrate, the overmold 140 may cover and/or obscure access to various components in the circuit package 100. Thus, overmolding may present challenges associated with maintaining physical or optical access to substrates having any number of optical regions.

The present disclosure describes various techniques for maintaining a void or recess (e.g., an optical window 142) or optical path through the overmold 140 such that a region (e.g., an optical region) remains uncovered and optically accessible via the FAU 122. For example, various embodiments described herein relate to utilizing a sacrificial cap which can be disposed on the substrate 106 over the optical region 154 to prevent the overmold 140 from covering the optical region 154. Based on performing a grinding process to remove some of the overmold and some of the sacrificial cap, a recess within the sacrificial cap can be exposed to reveal the optical window 142 therethrough, and ultimately, to expose the optical region 154 through the overmold 140. In this way, circuit packages including optical regions can be overmolded to created molded circuit packages while maintaining access and functionality of the optical region(s).

Techniques for providing simple and direct access to photonic interfaces (be they GCs, edge couplers, or others) of a substrate through an overmold can be advantageous and beneficial. Indeed, the present disclosure describes such techniques for providing optical windows through overmolded circuit packages as part of a process for forming the overmolded circuit packages.

Additional detail will now be provided in connection with an example process in which a sacrificial cap is used in providing an optical window to a portion of an optical region of a circuit package. Indeed, as mentioned above, it can be desirable to maintain an optical path from an external location of the circuit package to a GC or GC region of a circuit package (e.g., at the PIC) such that an FAU or other component may be coupled or joined thereto for facilitating photonic signal transmission via the GC.

Figure 2A:
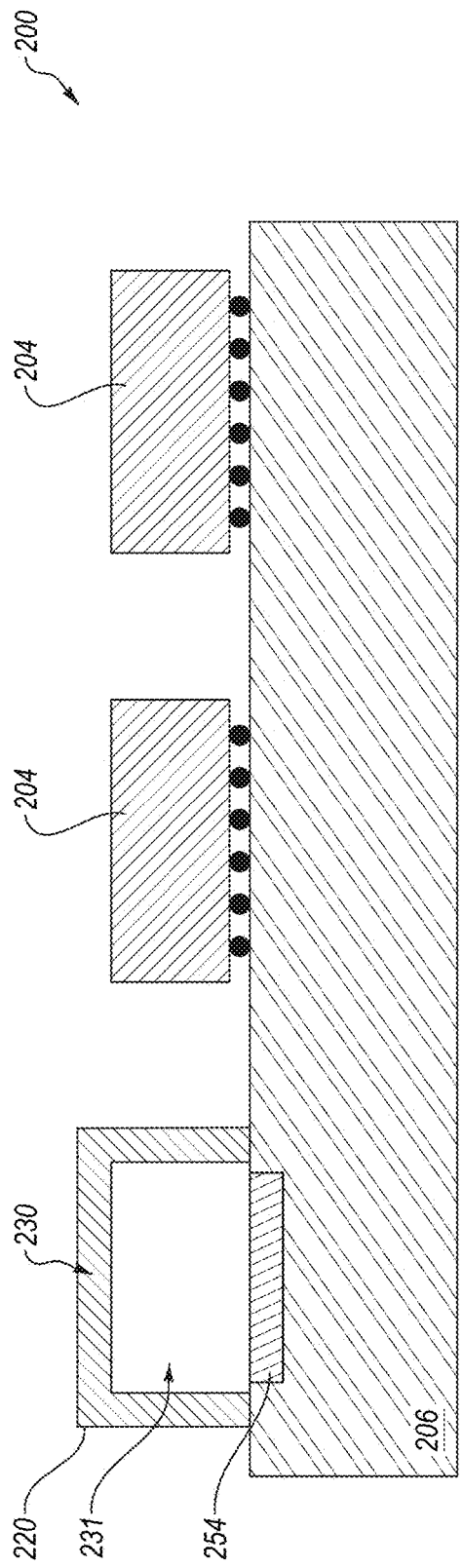
FIG. 2A illustrates a side view of a circuit package, according to at least one embodiment of the present disclosure.
Figure 2B:
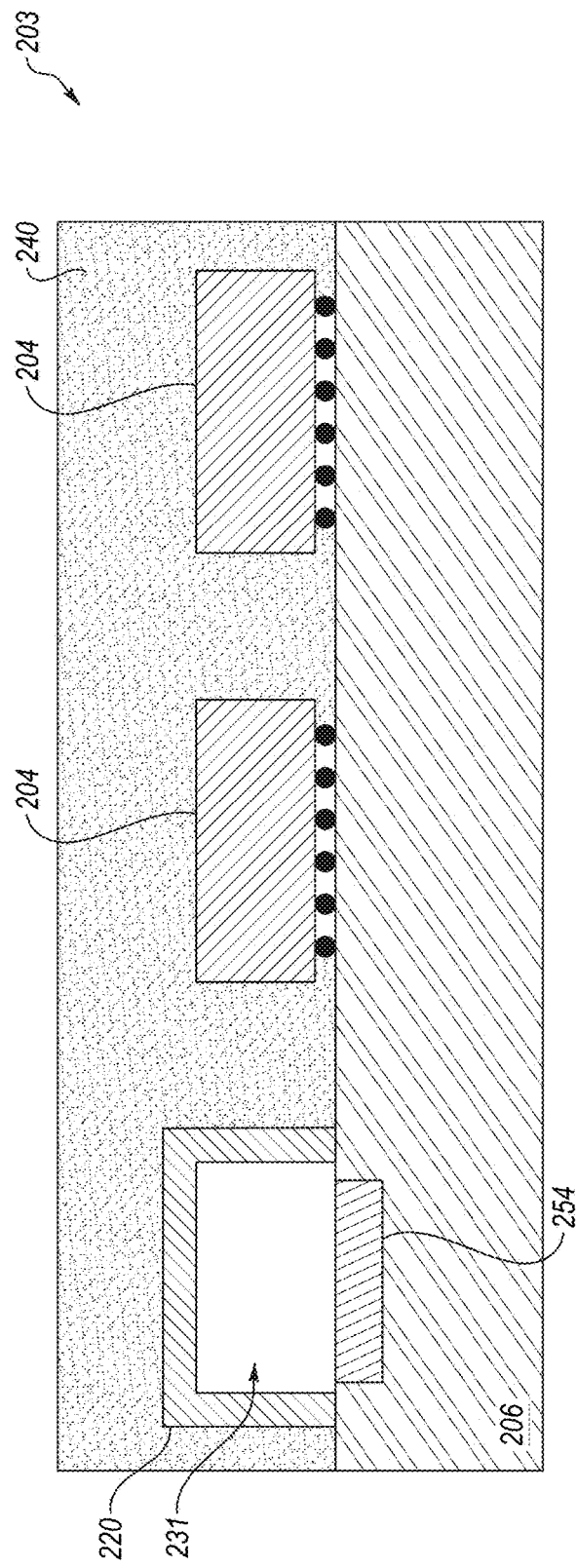
FIG. 2B illustrates a side view of an exemplary embodiment of forming a molded circuit package, according to at least one embodiment of the present disclosure.

FIG. 2A illustrates a side view of a circuit package 200, and FIG. 2B illustrates a side view of an exemplary embodiment of forming a molded circuit package 203, according to at least one embodiment of the present disclosure. In some cases, a sacrificial cap is disposed on a wafer 206 and incorporated as part of the circuit package 200. For example, the sacrificial cap 220 may be a component or structure which includes or defines a void or recess 231 at an inner portion of the sacrificial cap 220. The recess 231 may be a cutout or a vacant portion of the sacrificial cap 220 which is positioned at or facing a bottom surface of the sacrificial cap 220. For instance, when the sacrificial cap 220 is placed on the wafer 206, the recess 231 is disposed toward the wafer 206. While shown in 2-dimensions and as a tunnel through the sacrificial cap 220, it will be appreciated that the recess 231 may be a void entirely within a body of the sacrificial cap 220 such that the sacrificial cap 220 is continuous around a perimeter of the recess 231 with a bottom surface of the volume of the recess 231 being exposed at the bottom of the sacrificial cap 220. Thus, the recess 231 may not necessarily be a void through the sacrificial cap 220, but rather, a void disposed within the sacrificial cap 220.

As shown, the sacrificial cap 220 may be disposed on and connected to the wafer 206 over a GC region 254. For example, the wafer 206 may be a PIC having various photonic component therein, similar to one or more embodiments described herein. The GC region 254 may be representative of a GC (or other photonic interface) positioned within the wafer 206, or may be a region of several GCs (or other photonic interfaces). The sacrificial cap 220 may be bonded, glued or adhered to the wafer 206. For example, an adhesive layer may be applied and/or positioned between the sacrificial cap 220 and the wafer 206. In some cases, the adhesive layer is deposited on the sacrificial cap 220, or else the adhesive layer may be deposited on the wafer 206. The adhesive layer may be positioned around or surrounding the GC region 254 such that the GC region 254 is contained within an enclosed area defined by the adhesive layer. For instance, the adhesive layer may be positioned entirely around a perimeter of the GC region 254.

In this way, the sacrificial cap 220 may be adhered to the wafer 206 in a surrounding configuration around a periphery of the GC region 254. For instance, the GC region 254 may be entirely contained or covered by the sacrificial cap 220, for example, in the recess 231. The sacrificial cap 220 may be disposed on and bonded to the wafer 206 in conjunction with, before, or after placement of one or more other die components 204 on the wafer 206. As mentioned, the die components 204 may be electronic components such as processing components, memory components, and other electronic components as described herein.

As shown in FIG. 2B, a molding compound may be applied or disposed on the wafer 206 and the components disposed thereon to create an overmold 240. For example, the overmold 240 may be comprised of a molding compound deposited over the die components 204 and over a top surface of the wafer 206. Additionally, the molding compound may be deposited over the sacrificial cap 220. The overmold 240 may be made from a variety of materials having various properties. For example, in one or more embodiments, the overmold 240 is an epoxy molding compound in a liquid form that hardens and/or cures to secure elements of a circuit package in place when deposited over a surface of the circuit package. The overmold 240 covers each of the components positioned on the wafer 206 and fills in gaps between (and in some cases underneath) the components to cover any exposed and/or vacant areas of the circuit package 200. In this way the molded circuit package 203 may be created by applying the overmold 240 to the wafer 206.

The sacrificial cap 220 may be bonded to the wafer 206 such that the overmold 240 does not penetrate underneath the sacrificial cap 220, or between the sacrificial cap 220 and the wafer 206. Accordingly, because the sacrificial cap 220 has the recess 231 therein, and because the recess 231 is positioned over the GC region 254, a vacant space may be maintained above the GC region 254 by the sacrificial cap 220 where the overmold 240 does not enter. In other words, the overmold 240 does not come into contact with, and does not directly cover, the GC region 254 due to the sacrificial cap 220 and associated recess 231. For example, the recess 231 may be sized and shaped in accordance with the GC region 254 which it is positioned to cover. For example, a cross section or projection of the recess 231 onto the CG region may be approximately the same shape and/or size as the GC region 254. In some cases, the recess 231 may be slightly larger than the GC region 254. As will be discussed below, maintaining this space above the GC region 254 facilitates creating an optical window through the overmold 240 in connection with a grinding process, for providing access to the GC region 254.

In one or more embodiments, the sacrificial cap 220 is made of a similar type of material as the overmold 240. For example, the sacrificial cap 220 may be made of the same molding compound as the overmold 240. The sacrificial cap 220 may be pre-made using a molding compound (e.g., epoxy) that is placed into a die, mold, or template structure that, when hardened, produces the sacrificial cap 220 having the structure shown and described. In some cases, multiple sacrificial caps 220 are created at once from a mold or die having multiple instances of the sacrificial cap 220. The sacrificial cap 220 may be made of any suitable material, such as plastics and polymers, metals, substrate material (e.g., silicon), or any other material for creating a sacrificial cap to achieve the purposes described herein.

The dimensions of the recess 231 above the GC region 254 of the wafer 206 may be specifically determined in accordance with a grinding process to be performed on the molded circuit package 203. For example, in some cases, the recess 231 extends approximately the same height as the one or more die components 204 disposed on the wafer 206, or may extend further or thicker than the die components 204. In the least, the recess 231 is thick or tall enough such that the recess 231 is exposed after a grinding process has been performed. For example, the sacrificial cap 220 may be sized, shaped, and configured in accordance with a griding process to be performed such that an upper portion 230 of the sacrificial cap 220 is removed during the grinding process, exposing the recess 231 underneath.

In some cases, the sacrificial cap 220 has a height or thickness of 500-1000 microns thick, and the recess 231 extends to within 50-100 microns of the top surface of the sacrificial cap 220. In some cases, the recess 321 extends to within 25-75 microns of the top surface of the sacrificial cap 220. As an example, the sacrificial cap 220 may be 500 microns thick, and the recess 231 may extend 400-450 microns from the bottom of the sacrificial cap 220. In some cases, the sacrificial cap maybe 800 microns thick, and the recess 231 may extend 700-750 microns from the bottom surface. As another example, the sacrificial cap 220 may be 1000 microns thick and the recess 231 may extend 900-950 microns from the bottom surface.

In some cases, rather than having an entirely empty or vacant recess 231, one or more fill components may be positioned in the recess 231, completely or partially filling the recess 231. For example, the fill components may be non-functional or space-filling components positioned (e.g., loose, or temporality connected) in the recess 231. When the recess 231 is exposed from the later grinding process, the fill components may be removed to expose the GC region 254. The fill components in this way may facilitate taking up space within the recess 231 such that thermal expansion and/or contraction of gasses (e.g., air) within the recess 231 does not damage the sacrificial cap 220 or a bond of the sacrificial cap 220 to the wafer 206. For instance, the circuit package 200 may be exposed to elevated temperatures at one or more stages, and trapped gasses in the recess 231 may tend to thermally expand. In some cases, the fill components may be made of a material which experiences thermal contraction/expansion to a lesser degree, or not at all. In this way, the sacrificial cap 220 may be filled with less gas, which may in turn exhibit less overall thermal expansion, mitigating the risks of damaging the sacrificial cap 220.

In some embodiments, the sacrificial cap 220 is equipped with one or more holes or openings such that trapped gas may vent or escape under thermal expansion. For instance, these holes or openings may be small enough that the overmold 240 (e.g., in its liquid state) does not penetrate or flow into the recess 231 due to a viscosity of the (liquid) molding compound. In another example, the sacrificial cap 220 is equipped with a chimney-like structure which may extend upwards past the upper extent of the overmold 240 such that trapped gas may escape the recess 231 while preventing the molding compound from flowing into the recess 231.

Figure 3A:
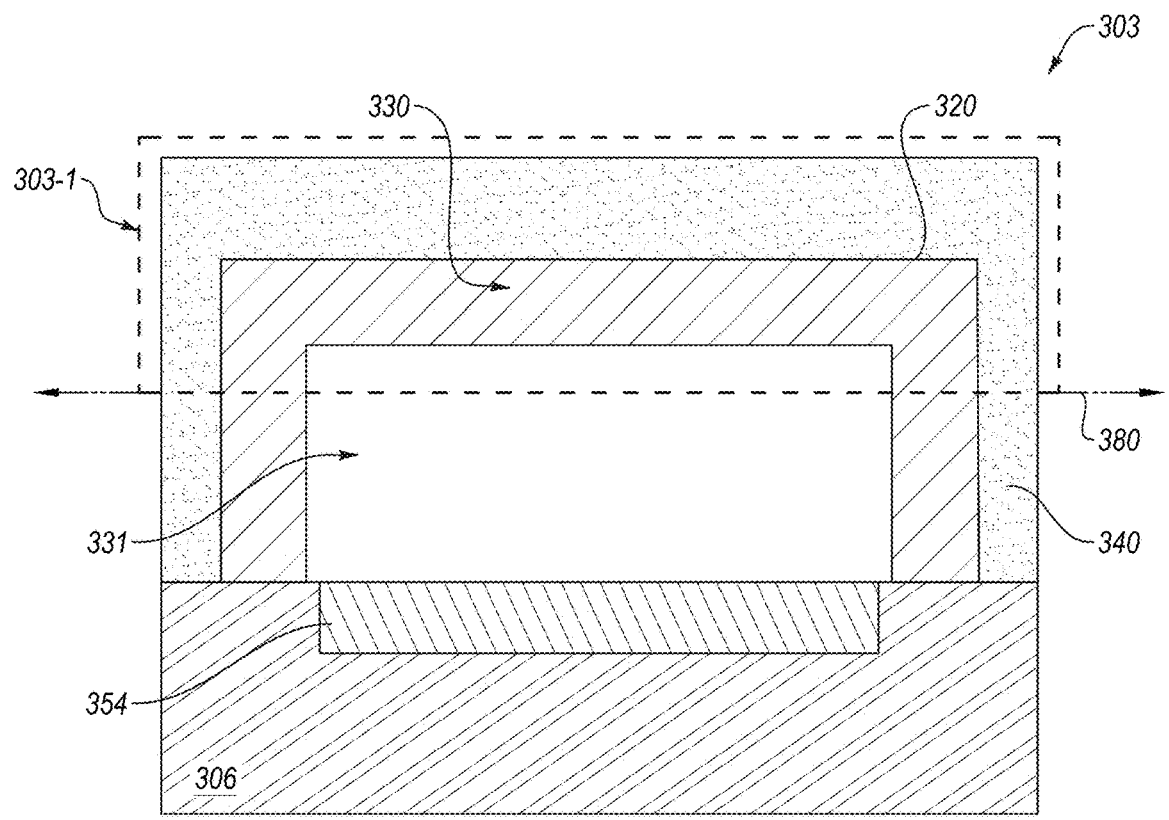
FIGS. 3A-3C illustrate side schematic views of a molded circuit package specifically zoomed in on a sacrificial cap after an overmold has been applied, according to at least one embodiment of the present disclosure.
Figure 3B:
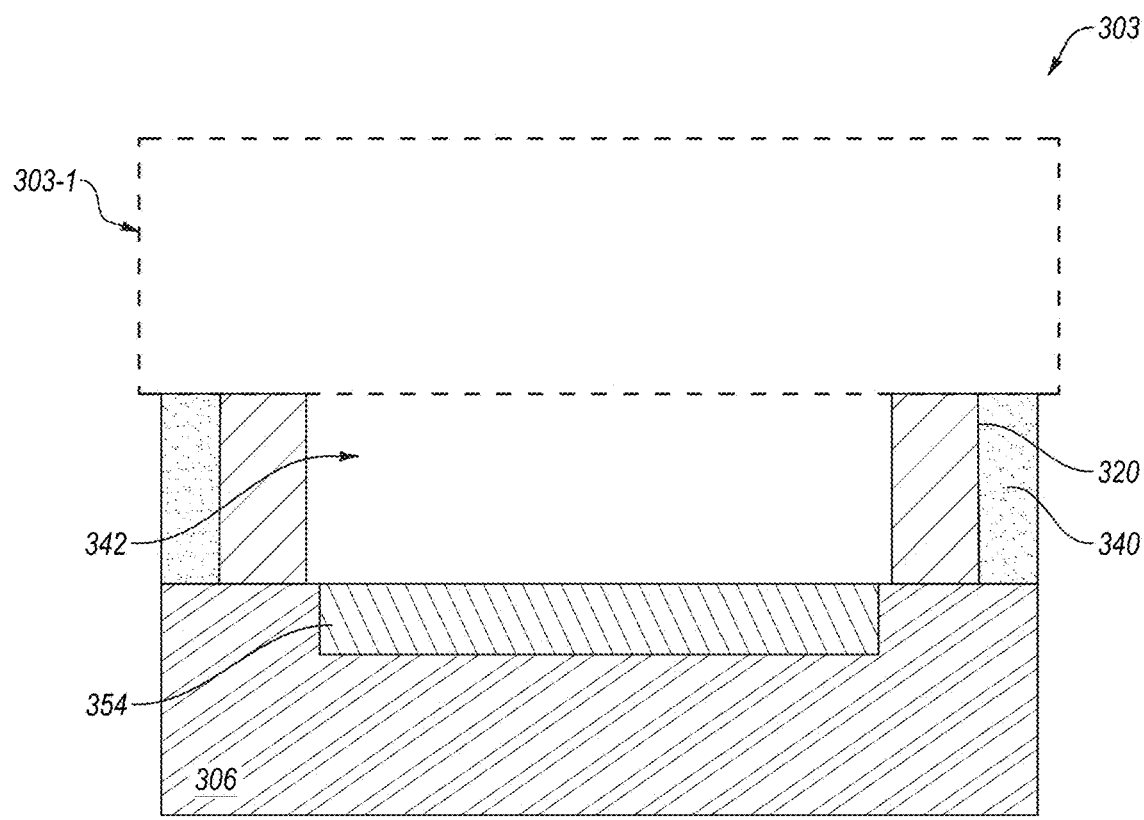
Figure 3C:
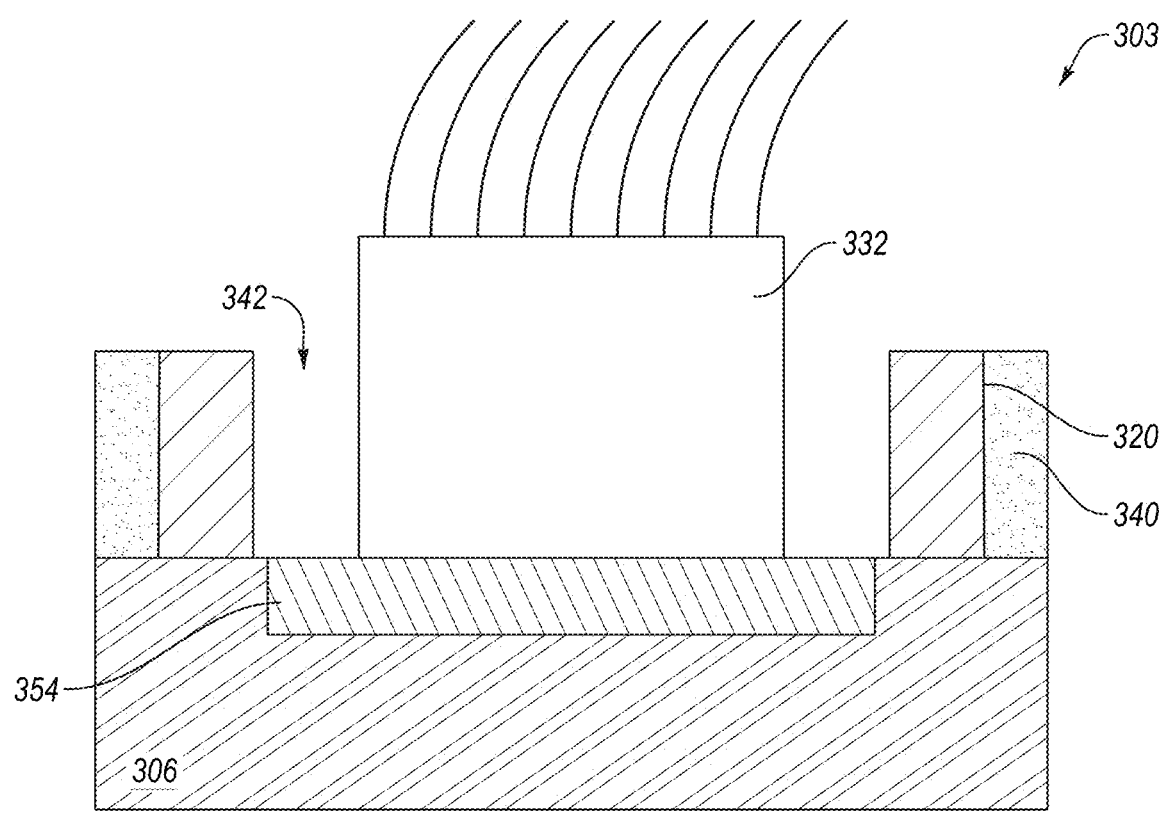

FIGS. 3A-3C illustrate side schematic views of a molded circuit package 303 specifically zoomed in on a sacrificial cap 320 after an overmold 340 has been applied, according to at least one embodiment of the present disclosure. The molded circuit package 303 and sacrificial cap 320 may be in accordance with that described in connection with FIGS. 3A and 3B above.

In some embodiments, after the overmold 340 has dried, cured, and/or hardened, one or more layers of overmold 340 may be removed. For example, the molded circuit package 303 may be operated on to perform a grinding process 380, which may remove a layer 303-1 of the molded circuit package 303. For instance, the layer 303-1 may be grinded, milled, etched, or otherwise removed from the molded circuit package 303. In some cases, the layer 303-1 may include a portion of the overmold 340. In some cases, a portion of the sacrificial cap 320 is removed in the layer 303-1 as part of the grinding process 380. For instance, a top portion 330 of the sacrificial cap 320 may correspond with the layer 303-1 and may be removed by the grinding process 380.

In particular, the grinding process 380 may be implemented in connection with the dimensions and/or geometry of the sacrificial cap 320, and more specifically, the dimensions and/or geometry of the recess 331. For example, the grinding process 380 may be such that it removes the layer 303-1 at a thickness corresponding with an entirety (or more) of the top portion 330 being removed from the sacrificial cap 320. Accordingly, the sacrificial cap 320 may be sized and configured in accordance with the grinding process 380, based on the various components disposed on the wafer 306. For instance, the sacrificial cap 320 may extend from the wafer 306 a greater distance than a thickness of any electronic components or dies positioned on the wafer 306. This may facilitate the recess 331 extending past the thickness of any components disposed on the wafer 306 such that the grinding process 380 may be performed to remove the top portion 330 of the sacrificial cap 320 down to the recess 331, for example, without contacting or reaching other components disposed on the wafer 306.

As shown, after the grinding process 380 and after the layer 303-1 (and top portion 330) are removed, an optical window 342 is now available that provides direct access to the GC region 354 on the wafer 306. For instance, the optical window 342 may extend and/or provide access through the overmold 340, such that the GC region 354 may be directly accessible through the overmold 340. For example, the optical window 342 (e.g., corresponding with a dimension of the recess 331) may span substantially all of the GC region 354.

As noted above, this optical window 342 is beneficial and provides advantageous access for one or more external components to interface with the wafer 306 at the GC region 354. For instance, as shown in FIG. 3C, an FAU 332 (or other optical interfacing component) can be inserting into and/or through the optical window 342 (e.g., through the overmold 340) such that the FAU 332 can couple with the GC region 354. The coupling of the FAU 332 and the GC region 354 may provide a mechanism whereby components of the molded circuit package 303 can communicate data with an external device by transmitting and receiving photonic signals via the GC region 354 and FAU 332 (or other photonic componentry).

FIGS. 4A-4C illustrate an example implementation related to packaging a wafer package and maintaining an optical window thereon, according to at least one embodiment of the present disclosure. In the illustrated example, a die component 404 may include a plurality of electronic components, such as high-bandwidth memory (HBM) components, processing components, or others. In some cases, the die component 404 includes a wafer base with multiple components disposed thereon, and the wafer base is bonded and electrically connected to the wafer 406. The die component 404 may be produced as one or more electronic components disposed on a wafer structure, and cut or diced to a final shape and/or dimension.

The die component 404 may be positioned on a wafer 406 and bonded thereto. The wafer 406 includes one or more GC regions 454 which may be positioned around a periphery of the die component 404. In this example, the wafer 406 may include any number of GC regions 454 that have been formed or otherwise deposited within the structure of the wafer 406. In this example, four GC regions 454 are shown around a perimeter area of the wafer 406, and around a positioning of the die component 404 on the wafer 406. Other examples may include fewer or additional GC regions 454. These GC regions 454 may be placed at any position within the structure of the wafer 406. When exposed in accordance with the techniques described herein, the GC regions 454 may include a structure or mechanism for receiving optical interface components, such as FAUs.

As shown in FIG. 4B, the die component 404 may be placed or otherwise deposited on a top surface of the wafer 406. In this example, the die component 404 structure is bonded to a top surface of the wafer 406 in a middle section of the wafer 406 with each of the GC regions 454 of the wafer 406 around an outside of the die component 404.

As shown in FIG. 4C an overmold 440 can be applied to the wafer 406 and die component 404, to create a molded wafer package 403. A portion or layer of the overmold 440 can be grinded off as described herein. In this example, optical windows 442 are preserved through the overmold 440 at each of the GC regions 454 despite the overmold 440 being applied over an entire top surface of the molded wafer package 403. Maintaining the optical windows 442 enables optical interface components, such as FAUs 432, to be coupled to the GC regions 454 to provide a connection between one or more external or off-chip devices to the electrical and optical components of the molded wafer package 403 as described herein.

While not specifically shown in FIG. 4C, the optical windows 442 may be maintained using one or more of the techniques described herein. To elaborate, the optical windows 442 may be created using a sacrificial cap disposed on the wafer 406 over the GC regions 454, after which a portion of the sacrificial cap is partially grinded off as described herein to expose the optical windows 442.

FIGS. 5A and 5B show another example implementation in which an EIC wafer 558 is bonded to a wafer 506, according to at least one embodiment of the present disclosure. The EIC wafer 558 may be a wafer structure having one or more electronic components 504 disposed on and bonded thereto. For example, the electronic components 504 may be disposed directly onto the EIC wafer 558, or one or more electronic components may be disposed on a separate die (e.g., substrate material) which is then joined onto the EIC wafer 558.

As shown in FIG. 5A, the EIC wafer 558 may be pre-cut, or may include one or more pre-cut portions 584 through the EIC wafer 558 which have been pre-cut or pre-diced partially or entirely through a substrate of the EIC wafer 558. In some cases, the EIC wafer 558 is substantially the same size and shape as the wafer 506. Alternatively, the EIC wafer 558 may have a different size and/or shape as the wafer 506. The EIC wafer 558 may be positioned over the wafer 506 and bonded thereto, as shown in FIG. 5B. Additionally, an overmold 540 is applied to the EIC wafer 558 (e.g., and any exposed upper surface of the wafer 506 in cases where the EIC wafer 558 is a different size and/or shape than the wafer 506) to create a molded wafer package 503.

The pre-cut portions 584 of the EIC wafer 558 may correspond to and/or align with locations of GC regions 554 of the wafer 506. In this example, the EIC wafer 558 includes four pre-cut portions 584 that correspond to four GC regions 554 on the wafer 506. The EIC wafer 558 may include additional or fewer pre-cut portions 584 corresponding to a similar number of GC regions 554 of the wafer 506.

In this example, the EIC wafer 558 is bonded to the wafer 506 such that a bottom surface of the EIC wafer 558 contacts with and bonds to a top surface of the wafer 506. When bonding these wafers together, the pre-cut portions 584 and the GC regions 554 align such that the GC region(s) 554 are optically accessible through the pre-cut portions 584, in furtherance of one or more techniques for maintaining optical windows 542 at the GC regions 554 through the overmold 540.

In some cases, the optical windows 542 may be created using sacrificial caps positioned on the EIC wafer 558 at and over the pre-cut portions 584. In this way, a grinding process may remove a portion of the sacrificial caps which may expose the optical windows 542 therethrough.

As shown in FIG. 5B, after the molded wafer package 503 has been fabricated and packaged, and the optical windows 542 formed therein, optical interface components, such as FAUs 532 may be coupled to the GC regions 554 which may provide connectivity to one or more external or off-chip device through photonic communication via the GC regions 554.

Figure 6A:
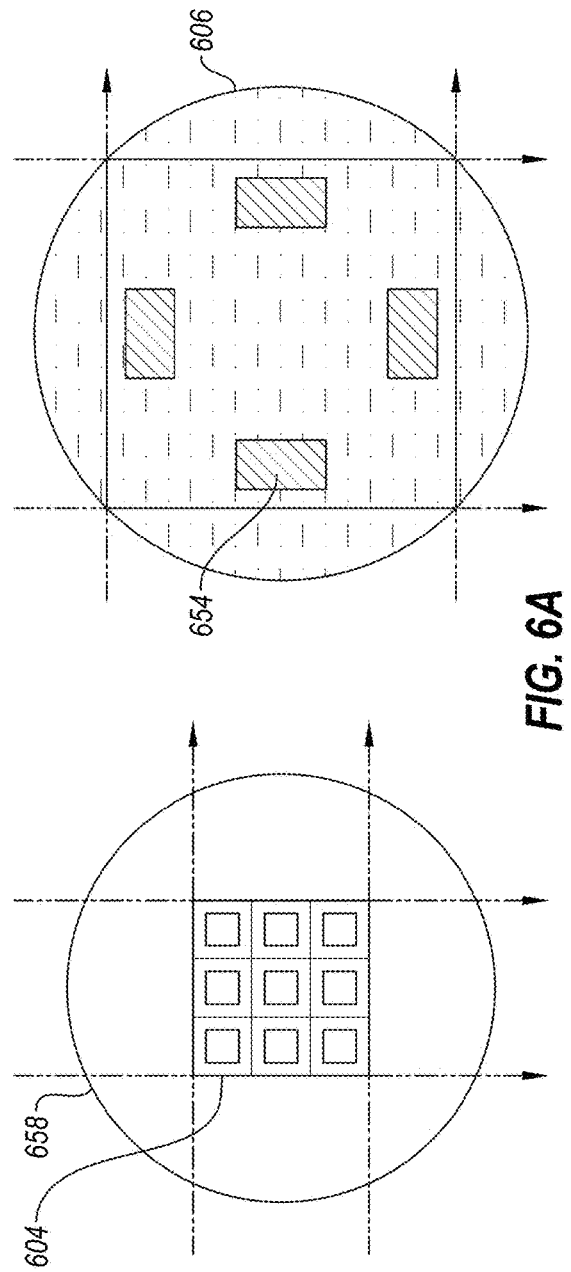
FIGS. 6A and 6B show an example implementation of creating a molded wafer package, according to at least one embodiment of the present disclosure.
Figure 6B:
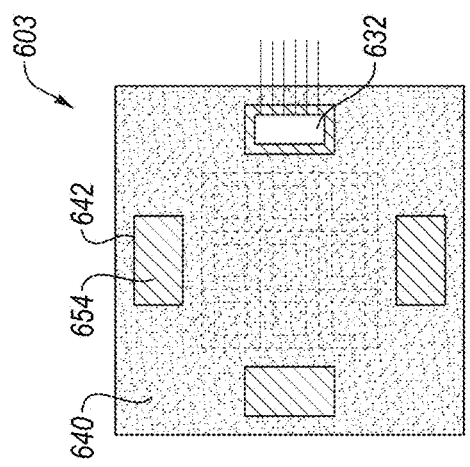

FIGS. 6A and 6B show another example implementation of creating a molded wafer package 603, according to at least one embodiment of the present disclosure. An EIC wafer 658 may include one or more electronic components 604 disposed thereon, either directly or through one or more separate die/substrate structures as described herein. The EIC wafer 658 may be diced one or more times to create a first shape having first dimensions of the EIC wafer 658, such as a rectangular wafer structure as shown. In a similar manner, a wafer 606 may be diced one or more times to create a second shape having second dimensions of the wafer 606. The wafer 606 may have one or more GC regions 654 deposited in or on the wafer 606.

In the illustrated example, the first shape and/or first dimensions of the sliced EIC wafer 658 may be different than the second shape and/or second dimensions of the diced wafer 606. For instance, the first shape and first dimensions of the EIC wafer 658 may be smaller than the second shape and second dimensions of the wafer 606. In this way, the EIC wafer 658 may fit within an area of the wafer 606. More specifically, the EIC wafer 658 may fit within an area of the wafer 606 without covering the GC regions 654 of the wafer 606. Accordingly, the EIC wafer 658 may be positioned on and bonded to the wafer 606.

As shown in FIG. 6B, an overmold 640 may be applied to the top surface of the EIC wafer 658 and to an exposed portion of the top surface of the wafer 606 to create a molded wafer package 603. Similar to other examples discussed above, optical windows 642 may be preserved through the overmold 640 to the GC regions 654. These optical windows 642 may be preserved using any of the techniques described herein, such as using one or more sacrificial caps. Maintaining the optical windows 642 enables optical interface components, such as FAUs 632, to be coupled to the GC regions 654 to provide a connection between one or more external or off-chip devices to the electrical and optical components of the molded wafer package 603 as described herein.

Figure 7A:
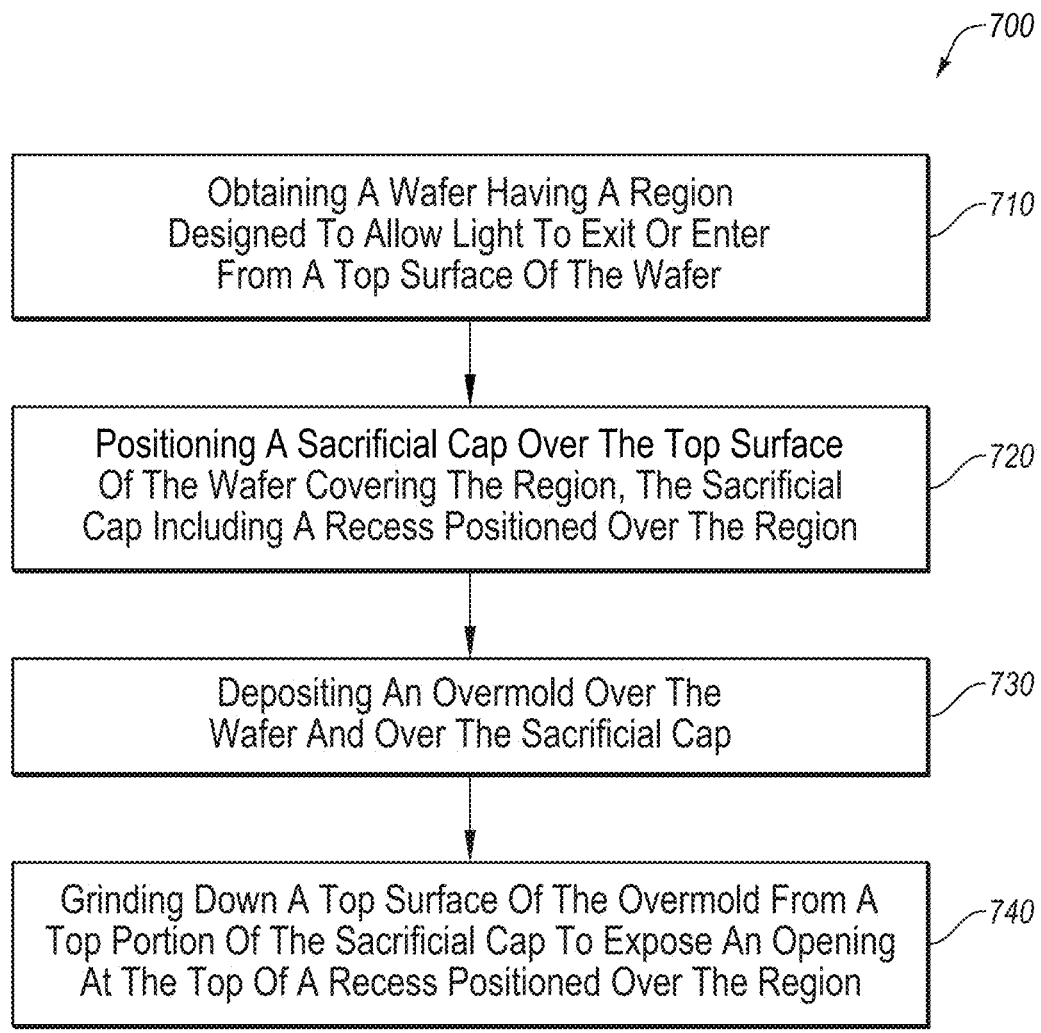
FIGS. 7A-7B illustrates flow diagrams for example series of acts for packaging electro-photonic circuits as described herein, according to at least one embodiment of the present disclosure.
Figure 7B:
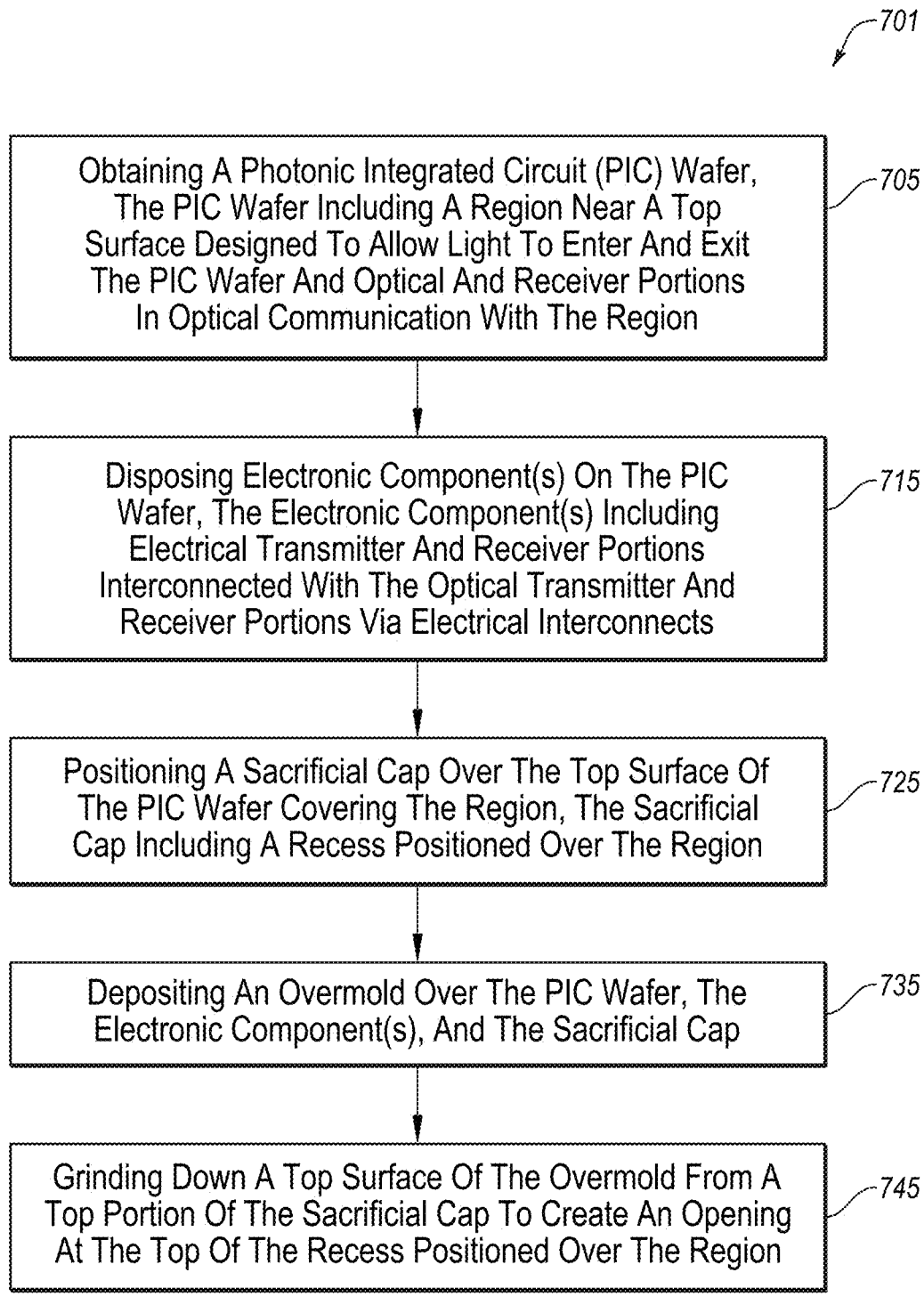

FIGS. 7A-7B illustrate flow diagrams for example methods or series of acts for packaging an electro-photonic circuit in accordance with various embodiments described herein. While FIGS. 7A-7B illustrates acts according to illustrated examples, alternative embodiments may add to, omit, reorder, or modify any of the acts of FIGS. 7A-7B.

FIG. 7A illustrates an example series of acts 700 in accordance with one or more embodiments described herein. As shown in FIG. 7A, the series of acts 700 includes an act 710 of obtaining a wafer having a region designed to allow light to exit or enter from a top surface of the wafer. As further shown, the series of acts 700 includes an act 720 of positioning a sacrificial cap over the top surface of the wafer covering the region, the sacrificial cap including a recess positioned over the region. In one or more embodiments, the act 720 includes positioning a sacrificial cap over the top surface of the wafer covering the region, wherein the sacrificial cap includes a recess formed therein where the recess is positioned over a portion of the region when the sacrificial cap is placed over the top surface of the wafer.

As further shown in FIG. 7A, the series of acts 700 includes an act 730 of depositing an overmold over the wafer and over the sacrificial cap. As further shown, the series of acts 700 includes an act 740 of grinding down a top surface of the overmold from a top portion of the sacrificial cap to expose an opening at the top of a recess positioned over the region. In one or more embodiments, the act 740 includes grinding down a top surface of the overmold where grinding down the top surface of the overmold includes grinding down from a top portion of the sacrificial cap to expose an opening at a top of the recess positioned over the portion of the region. In one or more embodiments, exposing the opening to the recess exposes an optical path to the region near the top surface of the wafer.

In one or more embodiments, the series of acts 700 includes coupling a plurality of optical fibers to the region using an optical interface component. In one or more embodiments, the optical interface component is a fiber array unit (FAU). In one or more embodiments, the FAU and the optical interface couple components of the electro-photonic circuit with one or more additional components off-chip from the electro-photonic circuit.

In one or more embodiments, the series of acts 700 includes, prior to depositing the overmold over the top surface of the wafer, disposing one or more electronic components on the top surface of the wafer, wherein disposing the one or more of electronic components over the top surface of the wafer comprises connecting electrical contacts on the one or more electronic components to bumps on the top surface of the wafer and forming electro-optical paths to and from the one or more electronic components to the region via waveguides formed within the wafer. In one or more embodiments, the one or more electronic components include one or more of a processor component, a memory component, or an analog mixed signal (AMS) block.

In one or more embodiments, prior to grinding down the top surface of the overmold, the top portion of the sacrificial cap extends over a top of the recess, and the top portion of the sacrificial cap has a thickness of greater than 25 microns. In one or more embodiments, a thickness between a top and bottom surface of the sacrificial cap prior to grinding down the top surface of the overmold is less than 1000 microns. In one or more embodiments, the overmold does not flow between the sacrificial cap and the wafer. In one or more embodiments, the sacrificial cap is made from a same overmolding material as the overmold that is deposited over the wafer.

FIG. 7B illustrates another example series of acts 701 in accordance with one or more embodiments described herein. As shown in FIG. 7B, the series of acts 701 includes an act 705 of obtaining a photonic integrated circuit (PIC) wafer, the PIC wafer including a region near a top surface designed to allow light to enter and exit the PIC wafer and optical and receiver portions in optical communication with the region. In one or more embodiments, the act 705 includes obtaining a PIC wafer including a region near a top surface of the PIC wafer designed to allow light to enter and exit the PIC wafer and optical transmitter and receiver portions in optical communication with the region, the optical transmitter and receiver portions having electrical interconnects to the top surface of the PIC wafer in a portion that does not extend into the region.

As further shown in FIG. 7B, the series of acts 701 includes an act 715 of disposing electronic component(s) on the PIC wafer, the electronic component(s) including electrical transmitter and receiver portions interconnected with the optical transmitter and receiver portions via electrical interconnects. In one or more embodiments, the act 715 includes disposing one or more electronic components on the PIC wafer, the one or more electronic components including electrical transmitter and receiver portions interconnected with the optical transmitter and receiver portions and forming electro-optical paths to and from the one or more electronic components to the region.

As further shown in FIG. 7B, the series of acts 701 includes an act 725 of positioning a sacrificial cap over the top surface of the PIC wafer covering the region, the sacrificial cap including a recess positioned over the region. In one or more embodiments, the act 725 includes positioning a sacrificial cap over the top surface of the PIC wafer covering the region where the sacrificial cap includes a recess formed therein, and where the recess is positioned over a portion of the region when the sacrificial cap is placed over the top surface of the PIC wafer.

As further shown in FIG. 7B, the series of acts 701 includes an act 735 of depositing an overmold over the PIC wafer, the electronic component(s), and the sacrificial cap. In one or more embodiments, the act 735 includes depositing an overmold over the PIC wafer, the one or more electronic components, and the sacrificial cap.

As further shown in FIG. 7B, the series of acts 701 includes an act 745 of down a top surface of the overmold from a top portion of the sacrificial cap to create an opening at the top of the recess positioned over the region. In one or more embodiments, the act 745 includes grinding down a top surface of the overmold where grinding down the top surface of the overmold includes grinding down from a top portion of the sacrificial cap to create an opening at a top of the recess positioned over the portion of the region.

The series of acts 701 may include additional features and acts including features and acts that are similar to other series of acts described herein. For example, in one or more embodiments, exposing the opening at the top of the recess exposes an optical path to the region near the top surface of the PIC wafer. In one or more embodiments, the series of acts 701 includes an act of coupling an optical fiber to a grating coupler in the region using an optical interface component. In one or more embodiments, the optical interface component is a fiber array unit (FAU). In one or more embodiments, the FAU optically couples components of the electro-photonic circuit with one or more additional components off-chip from the electro-photonic circuit via waveguides formed in the PIC wafer.

In one or more embodiments, the series of acts 701 includes, prior to depositing the overmold over the top surface of the PIC wafer, disposing one or more electronic components on the top surface of the PIC wafer where disposing the plurality of electronic components over the top surface of the PIC wafer comprises connecting electrical contacts on the electronic components to bumps on the top surface of the PIC wafer and forming electro-optical paths to and from the plurality of electronic components to the plurality of grating coupler regions via waveguides formed within the PIC wafer. In one or more embodiments, the one or more electronic components include one or more of a processor component, a memory component, or an analog mixed signal (AMS) block.

In one or more embodiments, prior to grinding down the top surface of the overmold, the top portion of the sacrificial cap extends over the top of the recess, and wherein the top portion of the sacrificial cap has a thickness of greater than 25 microns. In one or more embodiments, a thickness between a top and bottom surface of the sacrificial cap prior to grinding down the top surface of the overmold is less than 1000 microns. In one or more embodiments, the overmold does not flow between the sacrificial cap and the PIC wafer. In one or more embodiments, the sacrificial cap is made from a same overmolding material as the overmold that is deposited over the PIC wafer.

Additional details are now provided regarding circuit packages, including electro-photonic circuit packages. In particular, FIGS. 8A-8B, FIG. 9, and FIG. 10A-10D provide additional details regarding wafers, circuit packages, bidirectional photonic paths, and optical connections via an FAU.

As used herein, the term "photonic" refers to the use of light and/or photons for various applications. For instance, a "photonic path," "photonic channel," "photonic element," "photonic signal," and other similar uses operate based on the transmission of electromagnetic radiation as photons. For instance, in some cases photonic refers to the transmission, manipulation, and/or use of light, such as light in the visible spectrum, or from about 400 to about 700 nm. In some cases, photonic refers specifically to laser light. For example, in some cases photonic may include light or electromagnetic radiation in one or more of the ultraviolet spectrum (100 to 400 nm), the visible light spectrum (400 to 700 nm), or the infrared spectrum (700 nm to 1 mm). For example, in some cases herein, photons may be transmitted via a laser light source operating in any of these (or a smaller range) of wavelengths. In some cases, the term "optical" is used interchangeably herein to mean photonic.

Accordingly, a photonic path or photonic channel refers to the trajectory that photons (e.g., particles of light) follow through a medium or a device designed to guide or manipulate light. A photonic path can include waveguides, fibers, free space transmission paths, and other elements that provide precise control over photon behavior. In some instances, a photonic path includes a photonic elements which route light through a medium. In various implementations, a photonic path corresponds to both macroscopic (classical optics) and microscopic (quantum optics) manipulations of photons.

Figure 8A:
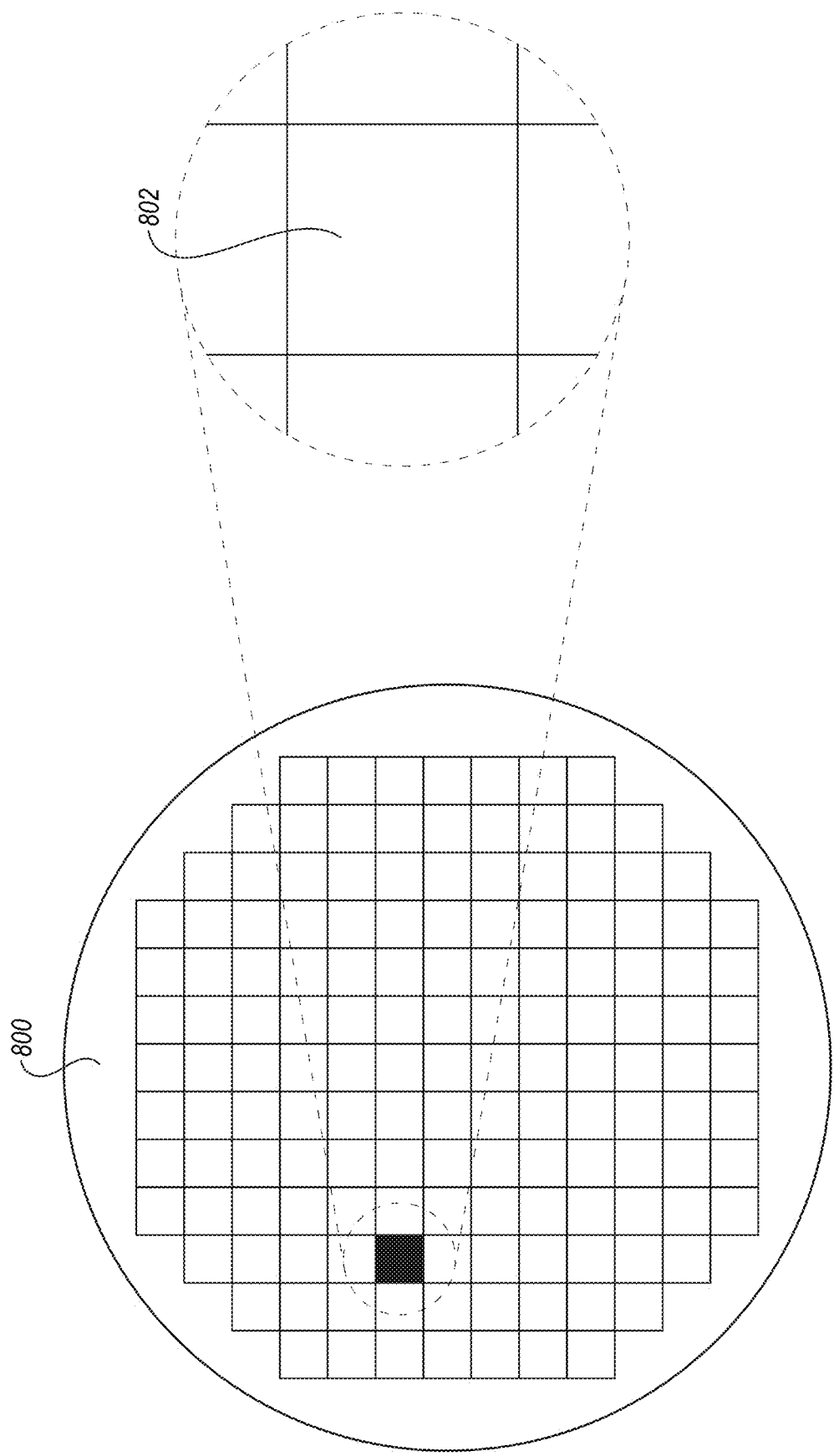
FIG. 8A illustrates a top view of a wafer and a die, which may be included in one or more circuit packages, according to at least one embodiment of the present disclosure.

In various implementations, various components of a circuit package may be created using wafers. For example, FIG. 8A corresponds to using wafers to create circuit package components according to some implementations. To illustrate, FIG. 8A shows a top view of a wafer 800 and a die 802, which may be included in one or more circuit packages (e.g., microelectronic packages).

In some instances, the wafer 800 is composed of semiconductor material and includes one or more dies having integrated circuit (IC) structures formed on the surface of the wafer 800. As shown, the wafer 800 may comprise multiple (and often many) dies, which may be copies or iterations of the same IC, or may be ICs of different variations. Each of the dies may be a unit of a semiconductor product or other hardware that includes a suitable IC. After the fabrication of the semiconductor product is complete, the wafer 800 may undergo a singulation process in which the dies are separated from one another to provide discrete "chips" of the semiconductor product. The die 802, and at least one other die, may be included in a microelectronic package with a PIC. Accordingly, a die as used herein may refer to a section or portion of a larger wafer structure having an IC formed thereon or may refer to that section or portion having been diced or cut from the wafer as a discrete chip.

A PIC can be formed in a second process using a second wafer (not shown) in a manner analogous to the fabrication of the die 802. While the die 802 may be used to fabricate electronic elements, such as EIC components, a PIC may be fabricated with optical components. In some implementations, the PIC can be embedded into a package substrate. The package substrate may be considered a cored or coreless substrate and may include one or more layers of dielectric material, which may be organic or inorganic.

The package substrate may further include one or more conductive elements, such as vias, pads, traces, microstrips, strip lines, etc. The conductive elements may be internal to, or on the surface of, the package substrate. Generally, the conductive elements may allow for the routing of signals through the package substrate or between elements coupled to the package substrate. In some implementations, the package substrate may be a printed circuit board (PCB), an interposer (e.g., an organic interposer), a motherboard, or other types of substrate.

In one or more implementations, the wafer 800 or the die 802 may include a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NANO flash memory, a solid-state drive (SSD) memory, a NOR flash memory, a CMOS memory, a thin-film transistor-based memory, a phase-change memory (PCM), a storage class memory (SCM), a magneto-resistive memory (MRAM), a resistive RAM, a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field-programmable gate array (FPGA), an artificial intelligence (AI) accelerator, or any other suitable circuit element.

Multiple instances of these devices may be combined on a single die. For example, the die 802 may include a memory comprising multiple memory arrays, one or more processors, other logic, communication circuits, and power management functions. The die may operate to execute instructions stored in the memory array or otherwise interact with the memory array using the processors on die 802.

Figure 8B:
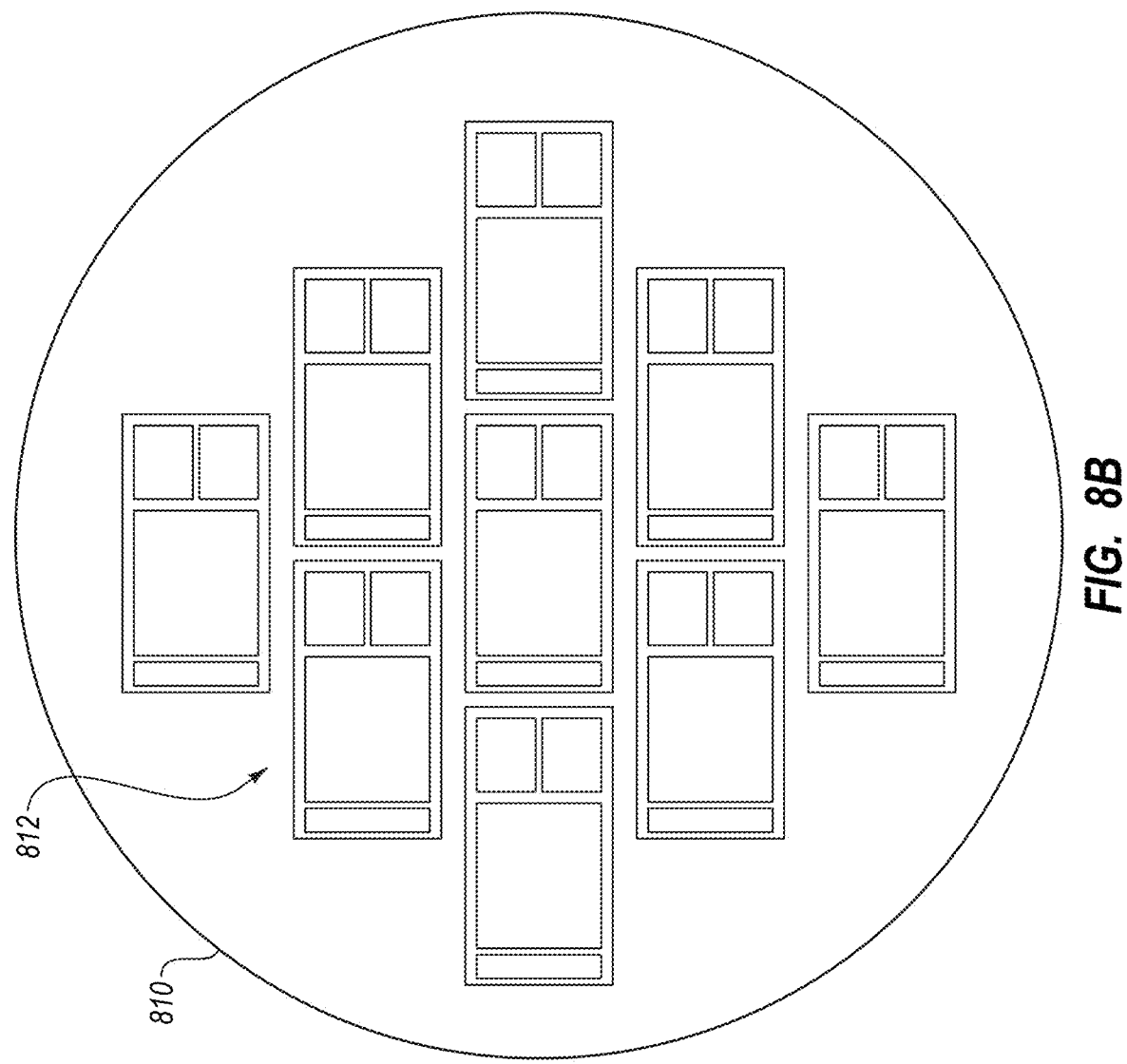
FIG. 8B illustrates a top view of a wafer having various components disposed thereon, according to at least one embodiment of the present disclosure.

As an additional example of using wafers, FIG. 8B corresponds to components formed on wafers, including one or more circuit packages according to some implementations. To illustrate, FIG. 8B shows a top view of a wafer 810 having various components disposed thereon. For example, one or more circuit packages 812 (e.g., electro-photonic circuit packages) may be formed from various electronic components disposed on a corresponding portion of the wafer 810.

In some cases, the wafer 810 may be composed of a substrate material such as silicon or another substrate material. The substrate may include one or more layers of a dielectric material, which may be organic or inorganic. The wafer 810 may be a PIC wafer having photonic components and/or an EIC wafer having electronic components. In various implementations, the wafer 810 provides various photonic interfaces, channels, photonic components, and other photonic features which, in connection with corresponding electronic components, may form one or more circuit packages 812.

Similar to the above description, the wafer 810 may further include one or more conductive elements, such as vertical interconnect accesses (vias), pads, traces, microstrips, strip lines, etc. The conductive elements may be internal to, or on the surface of, the wafer 810. Generally, the conductive elements may allow for the routing of signals (e.g., power and/or communication signals) through the wafer 810 or between elements coupled to the wafer 810. In some implementations, the wafer 810 may be a PCB, PIC substrate, an interposer (e.g., organic interposer), a motherboard, or another type of substrate.

As mentioned, the one or more circuit packages 812, including electro-photonic circuit packages, may be formed from various electronic components disposed on the wafer 810. In some cases, the electronic components are coupled to photonic components in the wafer 810. In various implementations, the one or more circuit packages 812 include a memory device, a computing device, a storage device, or a combination thereof.

Multiple instances of these examples may be combined in a circuit package. For example, a circuit package may include a memory comprising multiple memory arrays, one or more processors, other logic, communication circuits, and power management functions. Furthermore, the circuit package may execute instructions stored in the memory array or otherwise interact with the memory array using the processors on the one or more circuit packages 812.

In some cases, a single wafer may be advantageously manufactured and utilized for producing several circuit packages. For example, after the fabrication and/or assembly of the circuit packages is complete, the wafer 810 may undergo a singulation (e.g., dicing) process in which individual circuit packages are separated from one another to provide discrete "chips," as mentioned above. An electro-photonic circuit package may include any of the features and/or functionalities according to any of the circuit packages described in this document.

In some cases, each of the one or more circuit packages 812 of the wafer 810 is the same. In various implementations, one or more of the one or more circuit packages 812 (e.g., electro-photonic circuit packages) are configured differently.

In one or more implementations, the wafer 810 may be implemented in connection with various processing equipment by positioning, supporting, and/or securing the wafer 810 with respect to the processing equipment. In some cases, the processing equipment may manipulate, process, or otherwise operate on the wafer 810 as part of forming the one or more circuit packages 812, such as to form one or more TSVs at least partially through the wafer 810, to dispose, position, and/or bond dies to the wafer 810, to form overmolding on the wafer 810, or other processes.

Figure 9:
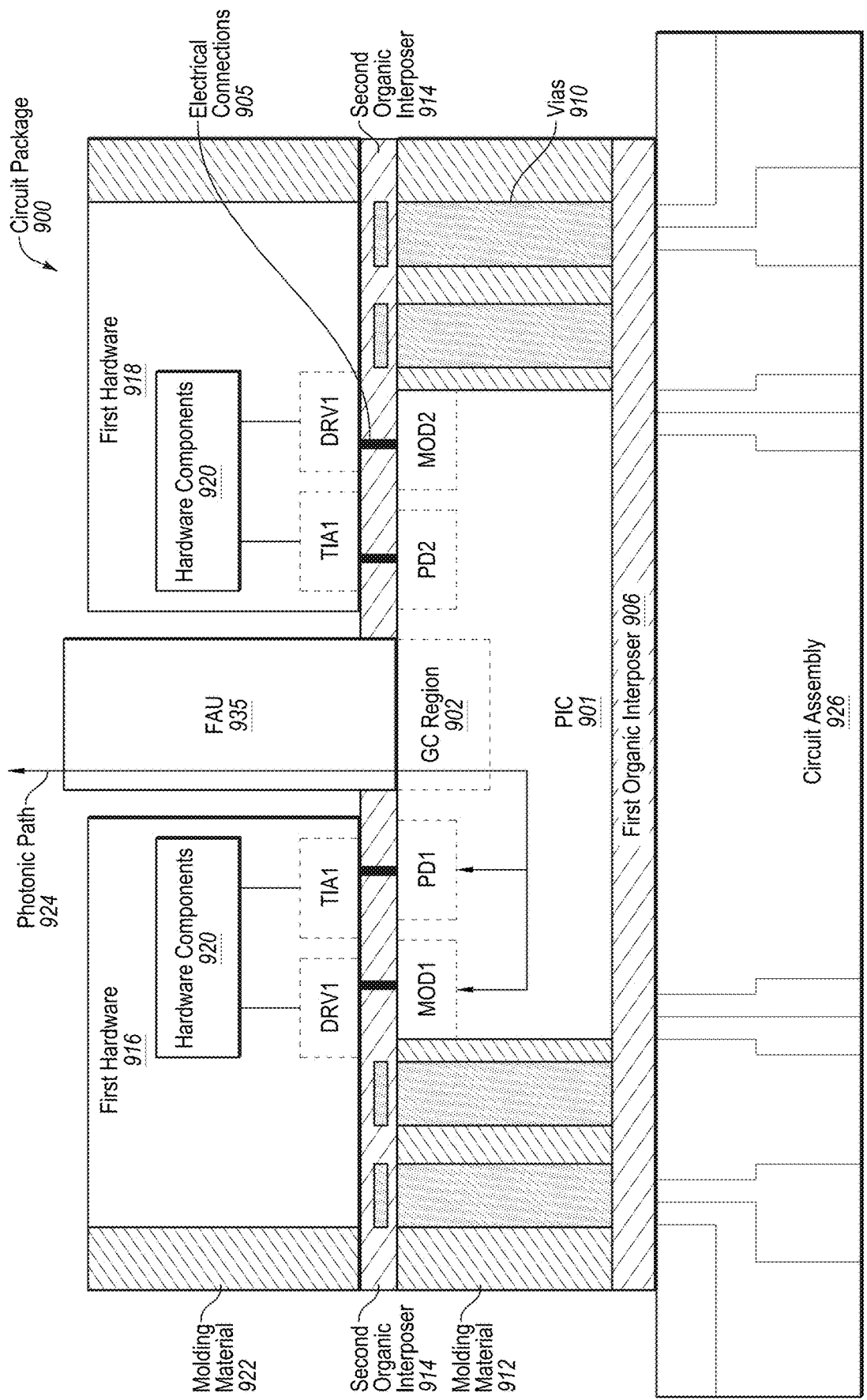
FIG. 9 illustrates and example side-view cross-section diagram of a circuit package that includes various components that are coupled to a fiber array unit, according to at least one embodiment of the present disclosure.

As mentioned above, circuit packages can include various components and connections. To illustrate, FIG. 9 shows an example side-view cross-section diagram of a circuit package that includes various components and that is coupled to a fiber array unit. In particular, FIG. 9 illustrates an example circuit package having various PIC components and EIC components according to some implementations. While FIG. 9 provides one example implementation of a circuit package that may be used in connection with a PIC and other circuit packages described in this document, FIG. 9 is not intended to limit all circuit packages.

As shown, FIG. 9 includes a circuit package 900 with a PIC 901, a first hardware 916 (e.g., a first die), and a second hardware 918 (e.g., a second die), each having one or more hardware components 920 and/or hardware elements. As shown, the PIC 901 includes a GC region 902 that allows photonic (e.g., optical or light) signals to enter and exit the PIC 901. In many implementations, the GC region 902 is coupled to an FAU 935, which sits between an internal cavity area within a second organic interposer 914.

As shown in FIG. 9, the PIC 901 is positioned over a first organic interposer 906. The first organic interposer 906 may be a redistribution layer (RDL) that provides any number of connection structures (e.g., interconnects or connection elements) through which components of the circuit package 900 and a circuit assembly 926 (e.g., a substrate) may communicate. For example, in some instances, the circuit assembly 926 is coupled to electrical or electro-photonic components that enable electrical communications to pass between the circuit package 900 and other components that are electrically coupled to the circuit assembly 926.

The first organic interposer 906 (and organic interposer layers such as the second organic interposer 914) may refer to a layer having a variety of thicknesses and which includes one or more input/output (I/O) pads (electrical connection elements) that provide connectivity for electrical elements of the circuit package to communicate electronically with other elements of the circuit package. The organic interposer layers (e.g., the first organic interposer 906 and the second organic interposer 914) may include wiring, interconnects, and other components that enable components of the circuit package 900 to be electrically coupled to components of one or more additional electronic packages.

In various implementations, the circuit package 900 provides optically accessible co-packaged optics to connect one or more external packages to the PIC 901. Indeed, the GC region 902 couples to the FAU 935 (or another optical interface component) such that some or all of a bidirectional photonic path within the circuit package 900 photonically communicates with a light engine or another external device. In turn, the bidirectional photonic path allows these external components to communicate with the hardware components (e.g., the first hardware 916 and the second hardware 918) of the circuit package 900 via a photonic path 924.

The circuit package 900 also includes vias 910 (e.g., conductive through vias such as through-silicon vias (TSVs), through-chip vias, or through-substrate vias). The vias 910 may be manufactured in any known way so electrical signals (such as power and control signals) can travel between the organic interposers. The vias 910 provide interconnectivity between different layers of an electrical system within the circuit package 900. In addition, it will be understood that while FIG. 9 illustrates four of the vias 910, the circuit package 900 may include any number of the vias 910 in various configurations. Further, while FIG. 9 illustrates a side view showing a single row of vias 910, additional vias may be manufactured toward additional axes (e.g., y-axis, z-axis) relative to the side view shown.

In some implementations, the vias 910 are formed by etching, removing, or otherwise forming a channel void, conduit, or passage, then depositing one or more conductive layers in the channel. In some cases, the vias may pass entirely from a top surface to the bottom surface of a substrate or material (e.g., an organic interposer). In some cases, the vias may connect to one or more conductive layers, such as to one or more organic interposers. In this way, the vias 910 may facilitate connecting one or more components positioned on opposite surfaces of an organic interposer, such as connecting EIC components in a hardware or die to corresponding components in a PIC opposite the organic interposer. Additionally, vias may facilitate providing power transmission to various hardware components of the electrical dies by transmitting the power from or through the bottom surface of the circuit package 900.

As further shown in FIG. 9, the circuit package 900 includes molding materials 912, 922 deposited as part of the process of manufacturing the circuit package 900. The molding materials 912, 922 may be made from a variety of materials having various properties. For example, in one or more implementations, the molding materials 912, 922 are epoxy molding compounds in a liquid form that secure elements of the circuit package 900 in place and cover certain elements contained within the structure of the circuit package 900.

As shown in FIG. 9, the circuit package 900 includes a second organic interposer 914. As mentioned above, the second organic interposer 914 may be an RDL that provides any number of connection structures (e.g., interconnects) through which components of the circuit package 900 may communicate. For example, the second organic interposer 914 includes connective elements and/or interconnects between the vias 910 and the hardware components (e.g., the first hardware 916 and the second hardware 918) within the electronic portion (e.g., the electrical layer) of the circuit package 900. The second organic interposer 914 also includes electrical connections 905 (e.g., electrical interconnects or interconnections, such as copper pillars or wires) between the hardware components and the photonic components (e.g., MOD1, MOD2, PD1, and PD2) in the PIC 901.

As further shown in FIG. 9, the circuit package 900 includes connected hardware components (e.g., dies having EIC components) attached above the second organic interposer 914. In some implementations, the hardware components may include analog-mixed signal (AMS) blocks with components for facilitating the transmission of signals between an electronic domain and a photonic domain. For instance, the AMS blocks include photonic modulator drivers (DRV1, DRV2) for controlling associated photonic modulators (MOD1, MOD2). The AMS blocks can also include serializers and de serializers between the photonic modulators and hardware components (shown in FIGS. 10A-10D), The modulators (MOD1, MOD2) receive photonic carrier signals and encode data into the carrier signals to transmit, via waveguides (e.g., a portion of the photonic path 924 located on the PIC 901), encoded or modulated photonic signals.

In various implementations, the AMS blocks also include transimpedance amplifiers (TIA1, TIA2) for receiving, through a connection to associated photo detectors (PD1, PD2), encoded photonic signals via one or more waveguides. In various implementations, the AMS blocks communicate with electrical hardware blocks (e.g., hardware components), which may refer to a variety of hardware blocks or dies, including EIC die(s) and/or application-specific integrated circuit (ASIC) die(s) having one or more of the components described in this document.

The electrical components of the electrical dies, such as the drivers (DRV1, DRV2) and the TIAs (TIA1, TIA2), may be connected to the corresponding photonic components in the PIC 901, such as MODs (MOD1, MOD2) and PDs (PD1, PD2), through electrical connections 905 (e.g., electrical interconnects). For example, the electrical connections 905 may be solder bumps, copper pillars, microbumps, or other interconnects for facilitating a connection of components at the surface of a wafer.

The electrical connections 905 may be printed, deposited, or otherwise positioned on a wafer in accordance with the topography, architecture, or layout of the photonic components in the PIC 901. For instance, the electrical connections 905 may be positioned on the surface of a wafer and may form a map or guide for orienting the positioning of the electrical dies (e.g., the first hardware 916 and the second hardware 918) on a wafer. In this way, disposing, positioning, bonding, or connecting components of EIC components with each electrical hardware to the wafer may include precisely aligning the EIC components with corresponding electrical connections to form electrical connections.

As mentioned above, in various implementations, the circuit package 900 is an electro-photonic circuit package that performs one or more computing, memory, or other functionalities and may communicate (e.g., transmit and/or receive) data via photonic signals. Indeed, the circuit package 900 may facilitate intra-chip electro-photonic communication as well as inter-chip electro-photonic communication.

The circuit package 900 includes a first hardware 916 and a second hardware 918, which may include one or more hardware components 920. The first hardware 916 and the second hardware 918 may have similar or different types of hardware components. For example, the first hardware 916 includes an ASIC chip that has been programmed, customized, or otherwise configured for a particular use. The first hardware 916 may additionally or alternatively include other types of hardware components (e.g., electrical hardware components).

The second hardware 918 may include a similar or different type of hardware components as the first hardware 916. For example, in one or more implementations, the second hardware 918 includes high bandwidth memory (HBM) hardware, a CPU, a GPU, a tensor engine, a neural compute engine, or an AI accelerator. Other implementations may include other types of hardware components. In one or more implementations, one or both of the hardware components are electronic hardware components.

While not shown in the illustrated example in FIG. 9, additional components and layers may be manufactured or otherwise added onto the surface of the circuit package 900. For example, one or more additional distribution layers may be added, and additional circuitry or hardware may be connected having a similar configuration as discussed in connection with any examples discussed herein.

As mentioned, the circuit package 900 couples with the FAU 935 or another type of optical interface (O/I) component(s), which attaches to the GC region 902 of the PIC 901 of the circuit package 900. The FAU 935 allows for optical fibers to be connected to the circuit package 900. Indeed, the interface block allows for an off-chip bidirectional photonic link to be created between the package hardware and external devices. In some implementations, the FAU 935 couples one or more optical fibers for transmitting photonic signals to and/or from the PIC 901 via the GC region 902.

In some implementations, the FAU 935 and the GC region 902 may facilitate receiving and transmitting (e.g., encoded) photonic signals between the circuit package 900 and other (e.g., off-chip) circuit packages. The GC region 902 of the PIC 901 may be an optical region that utilizes a photonic path or photonic connection with the FAU 935. For example, the FAU 935 directly mounts or connects to the GC region 902 such that photonic signals are transmitted directly between GCs in the GC region 902 and corresponding optical elements in the FAU 935.

FIGS. 10A-10D illustrate example versions of circuit packages that create a photonic path between a circuit package and one or more circuit packages and/or external devices. Similar to the above description, the packages include a GC region (GC) within a PIC coupled to an FAU (e.g., an optical interface O/I component). In some implementations, the PIC includes a GC region on the bottom surface, which enables the FAU or other optical interface component(s) to couple to the GC region on the bottom of the PIC.

Figure 10A:
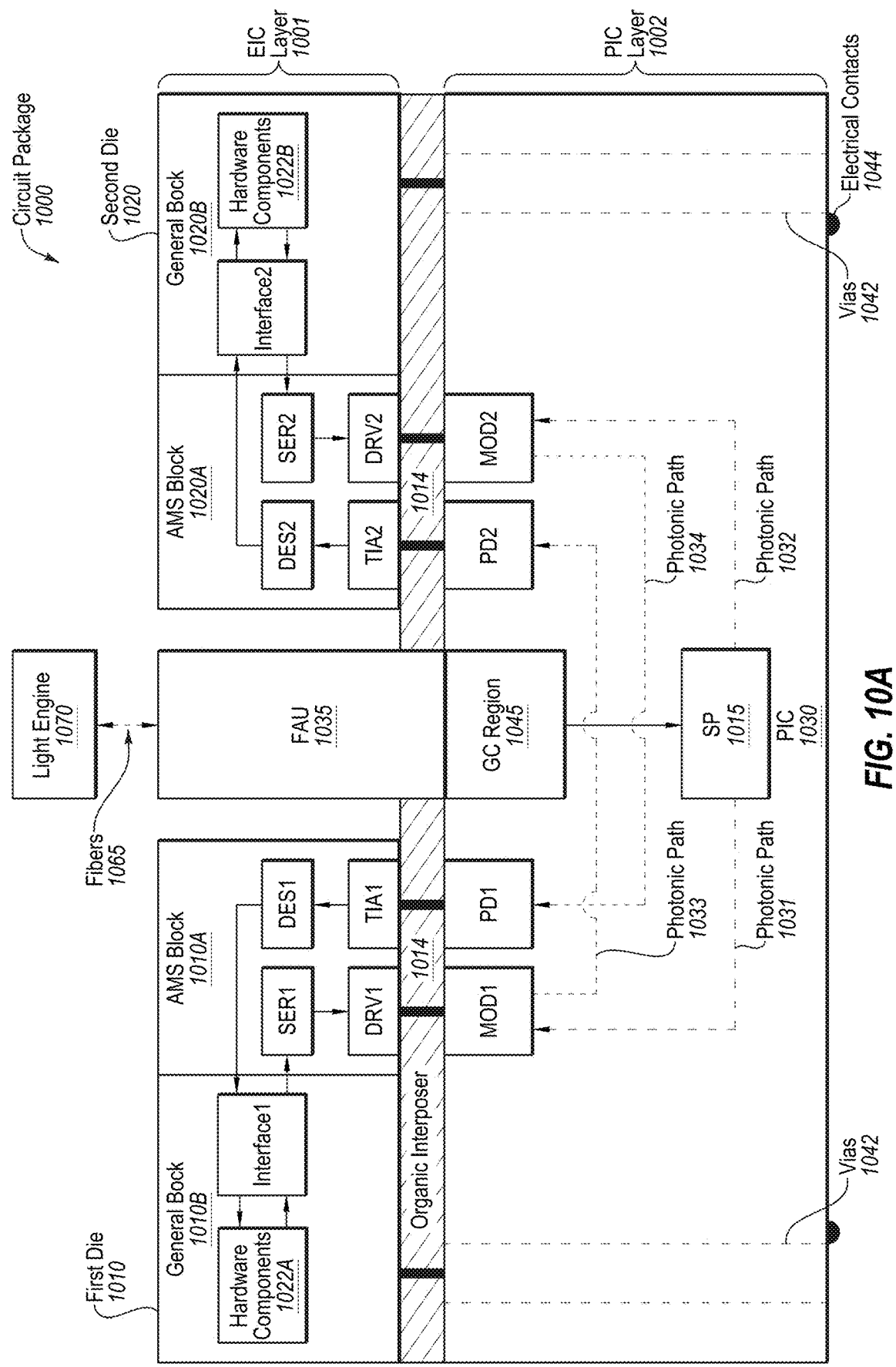
FIGS. 10A-10D illustrate example versions of circuit package that create a photonic path between a circuit package and one or more circuit packages and/or external devices, according to at least one embodiment of the present disclosure.

FIG. 10A shows an example package 1000 having an EIC layer 1001 with a first die 1010 and a second die 1020 having intra-chip connections therebetween. The circuit package 1000 also includes a PIC layer 1002 that includes the PIC 1030. To illustrate, FIG. 10A shows photonic paths starting at a light engine 1070 that pass through the FAU 1035 and the GC region 1045 to provide light to a PIC 1030. Additionally, the package 1000 includes a first die 1010, divided into a general block 1010B that may include various processing, storage, and communication functions and/or components (e.g., Interface1 and hardware components 922A), and an AMS block 1010A that includes analog/mixed-signal circuits for interfacing with the PIC 1030. The AMS block 1010A of the first die 1010 may include a driver (DRV1), a transimpedance amplifier (TIA1), a serializer (SER1), and a deserializer (DES1). An AMS block 1020A of the second die 1020 may include a driver (DRV2), a transimpedance amplifier (TIA2), a serializer (SER1), and a deserializer (DES2). A general block 1020B of the second die 1020 may include various processing, storage, and communication functions and/or components (e.g., Interface 2 and hardware components 922B). In some instances, the package includes molding material surrounding the PIC 1030 (e.g., an optical substrate).

As shown in FIG. 10A, the light engine 1070 (e.g., laser light source) transmits light via fibers 1060 to the FAU 1035 and from the FAU 1035 inside the PIC 1030 via the GC region 1045. In some instances, the GC region and the FAU is located on the bottom of the PIC, as described above. Once inside the PIC 1030, the light travels to a splitter 1015 (SP) that distributes the light over two different photonic paths 1031 and 1032 towards modulator MOD1 and modulator MOD2. Example modulator types include a Mach-Zehnder interferometer (MZI), ring resonator, electro-optic modulator (EOM), acousto-optic modulator (AOM), liquid crystal modulator (LCM), and digital micromirror device (DMD).

In one or more implementations, the splitter 1015, or a splitter tree, distributes the light over more than two different photonic paths to additional modulators. A photonic path may be implemented with any suitable optical transmission medium and may include a mixture of waveguides, fibers, and/or free-space optical transmission paths.

Modulator MOD1 modulates the light it receives from the splitter 1015 with information from driver DRV1 and transmits the modulated light to photodetector PD2 via photonic path 1033. Photodetector PD2 converts the received modulated light into an electrical signal for the second die 1020. Driver DRV1 serializer and SER1 in the first die 1010, together with transimpedance amplifier TIA2, and a deserializer DES2 in the second die 1020, along with modulator MOD1, photonic path 1033, and photodetector PD2, these elements form a data channel, or a unidirectional electro-photonic link, from the first die 1010 to the second die 1020.

Similarly, modulator MOD2 modulates the light it receives from the splitter 1015 with information from driver DRV2 and transmits the modulated light to photodetector PD1 via photonic path 1034. Photodetector PD1 converts the received modulated light into an electrical signal for the first die 1010. Driver 2 and serializer SER2 in the second die 1020, together with transimpedance amplifier TIA1 and deserializer DES1 in the first die 1010, along with modulator MOD2, photonic path 1034, and photodetector PD1, these elements form a data channel, or a unidirectional electrophotonic link, from the second die 1020 to the first die 1010.

As shown in FIG. 10A, the PIC 1030 (e.g., a photonic IC) is attached to an organic interposer 1014. The organic interposer 1014 may include a bondpad pattern (e.g., an electrical connection element) located over MOD1 and PD1 that matches a bondpad pattern on the first die 1010 located under DRV1 and TIA1, or is otherwise configured to form an electrical interconnection between the respective components. The organic interposer 1014 may also include a bondpad pattern located over PD2 and MOD2 that matches a bondpad pattern on the second die 1020 located under TIA2 and DRV2, or is otherwise configured to form an electrical interconnection between the respective components.

Two or more bondpads of the bondpad pattern on the first die 1010 are physically and electrically coupled with two or more bondpads of the bondpad pattern in the organic interposer 1014. Similarly, two or more bondpads of the bondpad pattern on the second die 1020 are physically and electrically coupled with two or more bondpads of the bondpad pattern in the organic interposer 1014.

In one or more implementations, the connective elements (e.g., interconnects) in the organic interposer 1014 connect the dies (e.g., the first die 1010 and/or the second die 1020) to the top surface of the PIC 1030. In addition, the interconnects may be implemented using a variety of structures, including copper pillars, solder connections, pads (e.g., bondpads), bump attachments, vias, or any variety of means by which the dies may be coupled to the PIC 1030.

In FIG. 10A, an electrical interconnect is shown making a coupling (or abutted coupling) between elements in the AMS blocks of the dies and the corresponding elements in the PIC 1030. In one or more implementations, the interconnect is a copper pillar no longer than 2 millimeters. In one or more implementations, the copper pillar can be less than 2 millimeters and, in some instances, less than 400 microns. In other implementations, the electrical interconnects can be solder bumps made of materials such as tin, silver, or copper. If solder bumps are used for the interconnects, then the solder bumps may be flip-chip bumps. In other implementations, the interconnects may be elements of a ball-grid array (BGA), pins of a pin grid array (PGA), elements of a land grid array (LGA), or another type of interconnect. In each of these examples, the interconnects can be less than 2 millimeters and, in some cases, range from 1 to 400 microns.

In general, the interconnects have drivers (DRVs) or transimpedance amplifiers (TIAs) at one end and optical modulators (MODs) or photodetectors (PDs) at the other end. For example, in one or more implementations, the interconnects (e.g., vias such as TSVs) may physically couple with, and allow electrical signals to pass between, electrical elements (e.g., pads) of the dies and/or the PIC 1030. For instance, vias 1042 pass through the PIC 1030 and electrically couple to electrical contacts 1044 at the bottom of the PIC 1030 or the circuit package 1000.

Additionally, in some instances, an electrical interconnect between a driver and a modulator allows the driver to provide an electrical signal that drives the modulator. In another instance, an interconnect between a transimpedance amplifier (TIA) and a photodetector allows the transimpedance amplifier to receive an electrical signal from the photodetector. In some implementations, the interconnects are such that a driver is stacked directly about a corresponding modulator with no lateral displacement between the two components and/or the two components are substantially in the same vertical column. Likewise, in some implementations, a TIA is stacked directly above a corresponding photodetector with no lateral displacement between the two components and/or the two components are substantially in the same vertical column.

The interconnects in the organic interposer may not have a uniform size, shape, or pitch. A finer pitch of interconnects may be desirable to allow a denser communication pathway between elements coupled to the PIC 1030. In one or more implementations, one or more interconnects have minimal lateral displacement. For example, an interconnect is a copper pillar that is straight up and down, perpendicular to the face of a die and the PIC 1030 (e.g., between 1-400 microns in length). This allows the electronic transceiver portions in the AMS block (e.g., DRV and TIA) to be directly stacked at one end of the interconnect above its respective photonic transceiver portion in the PIC (EAM and PD) at the other end of the interconnect. In some implementations, the DRV and TIA, as well as the EAM and PD, can be slightly offset from the copper pillar to reduce parasitic effects while still enabling a sub-400-micron gap (interconnect length) between heat-producing elements in the EIC/AMS and passive elements in the PIC 1030.

Figure 10B:
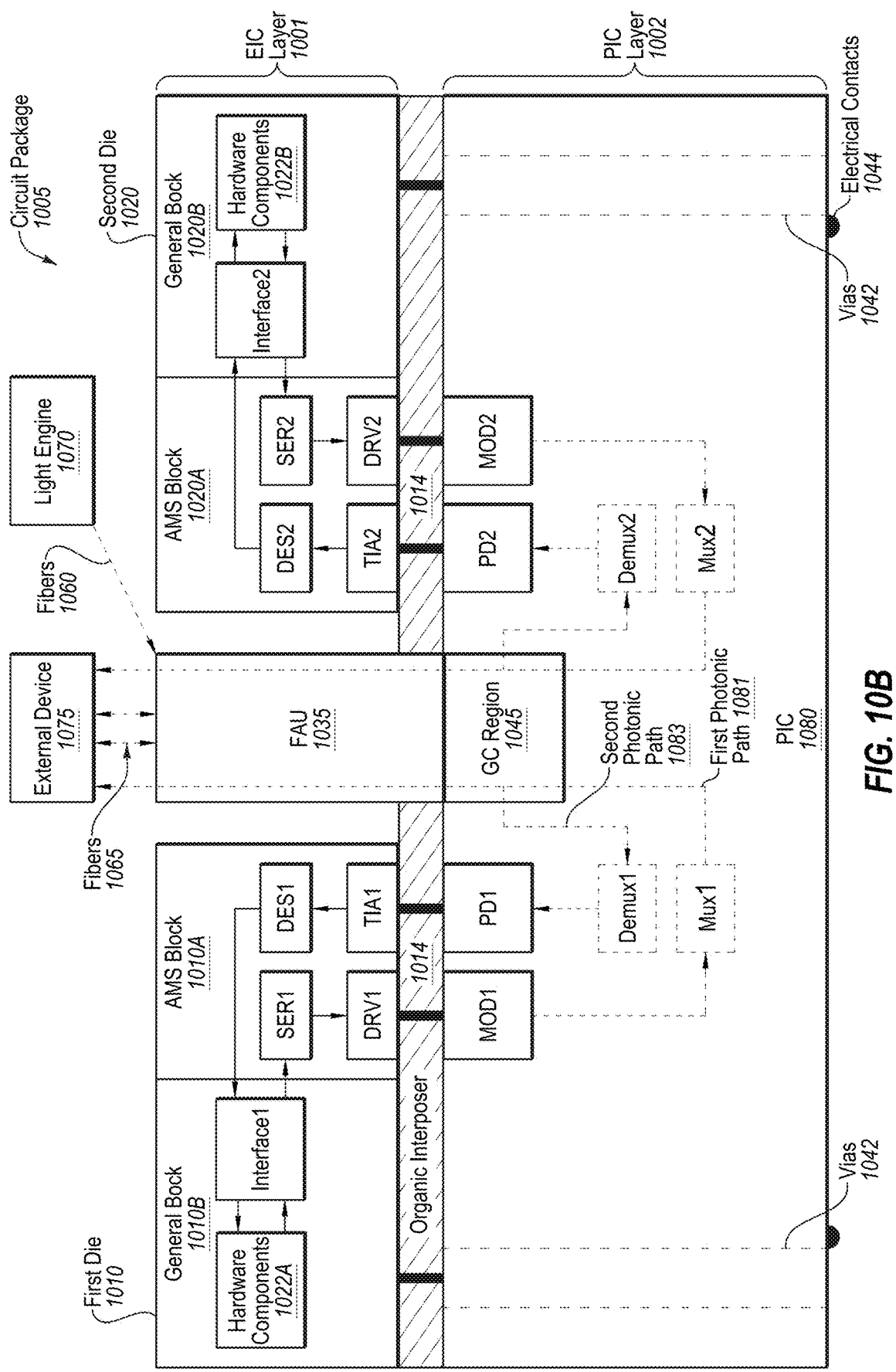

FIG. 10B shows an example of a circuit package 1005 that enables an inter-chip or inter-package connection. In particular, FIG. 10B shows a circuit package 1005 (e.g., an electro-photonic circuit package) with a photonic path between the circuit package 1005 and one or more external devices, which may include another circuit package. Similar to the description above, the circuit package 1005 includes the GC region 1045 of the PIC 1080 connected to an FAU 1035. The circuit package 1005 includes an internal cavity area in the organic interposer 1014 that enables the FAU 1035 to couple directly to the GC region 1045. Through the FAU 1035 and the PIC 1080, light signals can enter and exit the circuit package 1005. For example, one or more bidirectional photonic paths through the PIC 1080 allow dies connected to the PIC 1080 to communicate with other external devices.

In FIG. 10B, paths for unmodulated light have been omitted in the PIC 1080. Instead, FIG. 10B shows a first die 1010 and second die 1020 that can photonically communicate with an external device 1075 (e.g., an external device optical interface) via fibers 1065 (e.g., optical fibers), the FAU 1035, and the PIC 1080.

The first die 1010 may transmit data to the external device 1075 via hardware components 922A, Interface 1, SER1, DRV1, MOD1, and a first photonic path 1081. As shown, the first photonic path 1081 includes an optional multiplexer (MUX1) when wavelength division multiplexing is desired, a first grating coupler in the GC region 1045, the FAU 1035, and/or the fibers 1065. Similarly, the first die 1010 may receive data from the external device 1075 via a second photonic path 1083. The second photonic path 1083 includes the fibers 1065, the FAU 1035, a second grating coupler in the GC region 1045, and/or an optional demultiplexer when wavelength division demultiplexing is desired, PD1, TIA1, SER2 and Interface1 (I/F1). The first photonic path 1081 and the second photonic path 1083 (also referred to as unidirectional electro-photonic links) form a bidirectional data path between two devices on different chips.

While one or more of the above examples refer to specific types of dies, interconnects, substrates, grating couplers, and other specific elements associated with transmitting signals via respective components of the example packages, these are illustrative examples and may utilize different types of components. For example, the two (or more) dies may refer to a variety of hardware or dies and not necessarily the pairing of a general die and an AMS die as described in specific implementations herein. Indeed, the two dies may be similar types of hardware and may refer to computing hardware, processing hardware, storage hardware, memory hardware, or other hardware that is implemented on dies and may be coupled to a PIC that optically couples one or more of the dies to an external component in accordance with one or more implementations described herein.

As mentioned above, inter-chip or inter-package connections can include a photonic pathway in both directions (e.g., a bidirectional electro-photonic path), through which data may be communicated between a variety of external components (e.g., another circuit package) that are configured with the external device. In addition, it should be noted that features and functionality of the circuit package may be implemented within a variety of implementations and configurations of packages having different components, setups, and configurations.

Figure 10C:
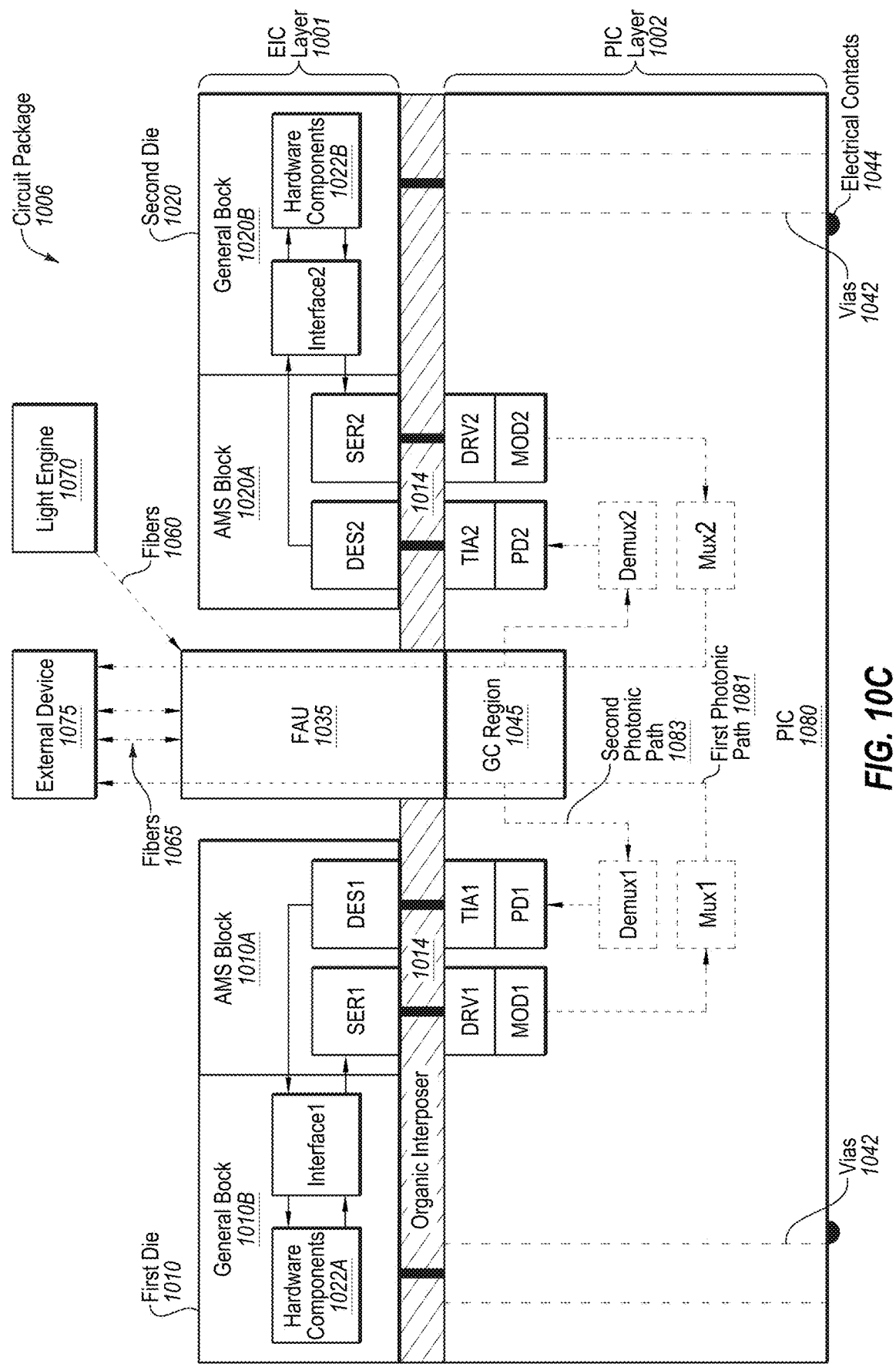

FIG. 10C illustrates another example of the circuit package 1006 that enables an inter-chip or inter-package connection. As with the circuit package 1005 in FIG. 10B, the circuit package 1006 in FIG. 10C can represent an electro-photonic circuit package with a photonic path between the circuit package 1006 and one or more external devices, which may include another circuit package.

Differing from the circuit package 1005 of FIG. 10B, the circuit package 1006 in FIG. 10C shows the drivers and the transimpedance amplifiers, located on the PIC 1080 rather than in the dies. In particular, driver DRV1 is connected to modulator MOD1 in the PIC 1080, and transimpedance amplifier TIA1 is connected to photodetector PD1 in the PIC 1080. Similarly, the circuit package 1006 shows that driver DRV2 is connected to modulator MOD2 in the PIC 1080, and that transimpedance amplifier TIA2 is connected to photodetector PD2 in the PIC 1080.

The drivers (DRV1, DRV2) and modulators (MOD1, MOD2) may be directly connected, connected via an electrical connection, or otherwise electrically connected. Similarly, the transimpedance amplifiers (TIA1, TAI2) and the photodetectors (PD1, PD2) may be directly connected, connected via an electrical connection, or otherwise electrically connected. In various implementations, connecting drivers with modulators and transimpedance amplifiers with photodetectors in close proximity causes the heat from the drivers and transimpedance amplifiers to thermally stabilize the modulators and photodetectors to operate in optimal operational ranges.

Additionally, similar to the circuit package 1005 of FIG. 10B, the circuit package 1006 in FIG. 10C includes serializers (SER1, SER2) and deserializers (DES1, DES2) in the AMS blocks. However, the serializers and deserializers in the circuit package 1006 connect to the drivers and transimpedance amplifiers via the organic interposer 1014 rather than within the AMS blocks.

As mentioned, the circuit package 1006 includes an organic interposer 1014 between the PIC 1080 and the dies (e.g., the first die 1010 and the second die 1020). The organic interposer 1014 may include a bondpad pattern (e.g., an electrical connection element) located over DRV1 and TIA1 that matches a bondpad pattern on the first die 1010 located under SER1 and SER2, or is otherwise configured to form an electrical interconnection between the respective components. The organic interposer 1014 may also include a bondpad pattern located over TIA2 and DRV2 that matches a bondpad pattern on the second die 1020 located under DES2 and SER2, or is otherwise configured to form an electrical interconnection between the respective components.

Two or more bondpads of the bondpad pattern on the first die 1010 are physically and electrically coupled with two or more bondpads of the bondpad pattern in the organic interposer 1014. Similarly, two or more bondpads of the bondpad pattern on the second die 1020 are physically and electrically coupled with two or more bondpads of the bondpad pattern in the organic interposer 1014.

In one or more implementations, the connective elements (e.g., interconnects) in the organic interposer 1014 connect the dies (e.g., the first die 1010 and/or the second die 1020) to the top surface of the PIC 1030. In addition, the interconnects may be implemented using a variety of structures, including copper pillars, solder connections, pads (e.g., bondpads), bump attachments, vias, or any variety of means by which the dies may be coupled to the PIC 1030. Other similarities discussed above with the circuit package 1005 in FIG. 10B may also apply to the circuit package 1006 of FIG. 10C.

Figure 10D:
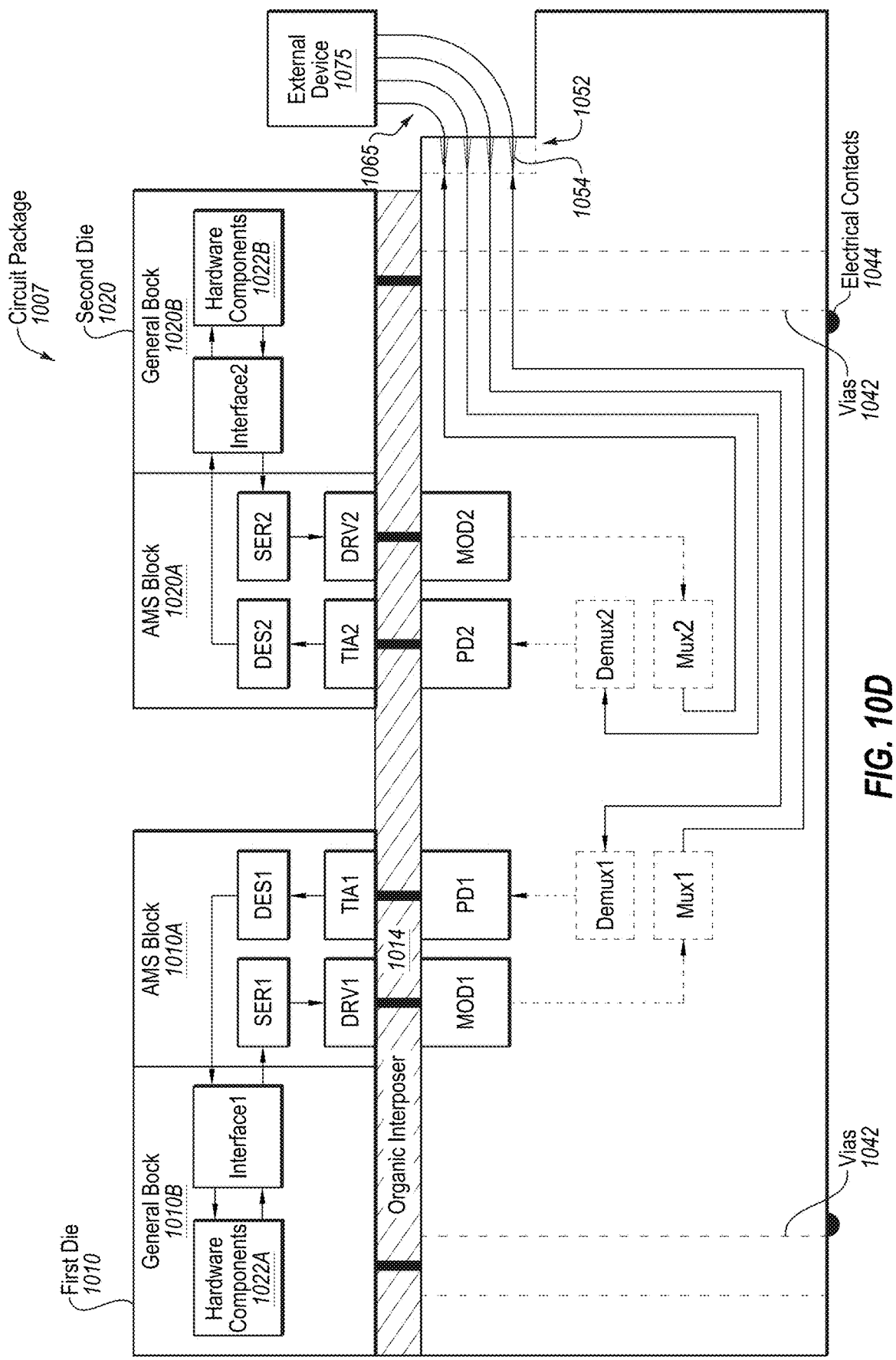

FIG. 10D illustrates another example of the circuit package 1007 having inter-chip or inter-package connections via an edge coupler 1052, according to embodiments of the present disclosure. The edge coupler 1052 may be located at an edge of the PIC 1080 and/or PIC layer 103 and may facilitate photonically connecting one or more optical fibers 1065 (e.g., horizontally) at the edge of the PIC 1080 to photonically connect the circuit package 1007 with an external device 1075. For example, the edge coupler 1052 may be positioned at an edge that is formed in the PIC 1080 after the PIC 1080 is diced to separate and/or isolate the circuit package 1007 as a discrete chip from one or more other circuit packages that may be formed on a larger wafer structure.

The edge coupler 1052 may include one or more (typically many) alignment features 1153, such as grooves (e.g., V-grooves), slots, cutouts, or other geometries which may receive and/or align the optical fiber(s) 1065 such that the optical fiber(s) 1065 align with one or more waveguides within the PIC 1080. For instance, these alignment features 1153 may be structures which are designed with a tapered or mode-matching region, to align modes of the optical fibers 1065 and the waveguides at the edge of the PIC 1080 thereby reducing insertion loss and enhancing coupling efficiency therebetween. The waveguides may connect to the various photonic components of the PIC 1030 in any manner described herein (e.g., including any other photonic components of the PIC 1030 as described). In this way, the edge coupler 1052 may provide a photonic interface for the photonic components of the PIC 1030 to transmit and receive off-chip photonic signals, similar to the GC region 1045 as described above.

The edge coupler 1052 may be implemented in the circuit package 1007 as an alternative to the GC region 1045 and FAU 1035, or else may be included in addition to these components. For example, in some implementations the GC region 1045 and the edge coupler 1052 are each photonic interfaces which achieve similar objectives of facilitating photonic communication to and/or from the circuit package 1007 with another device, and the circuit package 1007 may be implemented with only one type of these photonic interfaces. For instance, in some cases the GC region 1045 and FAU 1035 may facilitate a vertical or top connection of one or more optical fibers 1065, and the edge coupler 1052 may facilitate a horizontal or side connection of one or more optical fibers 1065. Accordingly, the GC region 1045 or else the edge coupler 1052 may be particularly suited for a specific implementation, space, and/or packaging requirement of the circuit package 1007. In other cases, the circuit package 1007 may be implemented with both the GC region 1045 and the edge coupler 1052, for example, for providing adaptability and connectivity to many different types of devices.

The PIC 1080 and the circuit package 1007 as described above may be exemplary of any of the wafers, circuit packages, wafer packages, or other connections and/or collections of components as described in any of the embodiments herein. For example, various embodiments herein may be described as having a wafer, PIC, PIC wafer, substrate, dies, EIC, etc., and it should be understood that any of these embodiments (e.g., and others described herein) may be implemented having any of the features, components, or configurations as described in FIGS. 8A-10D. For instance, in cases where an electronic component, die, EIC, chip, etc., is described as being connected to, coupled to, positioned on, disposed on, bonded to, etc., in connection with a PIC or PIC wafer (or the like), it should be understood that such components are positioned with respect to photonic components in the PIC wafer and correspondingly connected to the same via electronic interconnects.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for packaging an electro-photonic circuit, comprising:
    obtaining a substrate having an optical region configured to allow light to exit or enter from a top surface of the substrate;
    positioning a sacrificial cap on the top surface of the substrate covering the optical region, wherein the sacrificial cap includes a top portion and a recess formed therein under the top portion, and wherein the recess is positioned over the optical region when the sacrificial cap is positioned over the top surface of the substrate;
    depositing an overmold over the top surface of the substrate and over the sacrificial cap; and
    grinding down a top surface of the overmold, wherein grinding down the top surface of the overmold includes grinding down the top portion of the sacrificial cap to expose the recess, wherein the recess provides a void over a substantial portion of the optical region prior to grinding.

2. The method of claim 1, wherein exposing the recess exposes an optical path to the optical region.

3. The method of claim 1, further comprising coupling a plurality of optical fibers to the optical region using an optical interface component.

4. The method of claim 3, wherein the optical interface component is a fiber array unit (FAU).

5. The method of claim 1, wherein:
the substrate comprises bumps on the top surface of the substrate and waveguides formed within the substrate; and
the method further comprises, prior to depositing the overmold over the top surface of the substrate, disposing one or more electronic components on the top surface of the substrate, wherein disposing the one or more electronic components over the top surface of the substrate comprises electrically connecting the one or more electronic components to the bumps on the top surface of the substrate to form electro-optical paths to and from the one or more electronic components to the optical region via the waveguides formed within the substrate.

6. The method of claim 1, wherein obtaining the substrate comprises obtaining a substrate comprising bumps on the top surface of the substrate, waveguides formed within the substrate, one or more electronic components disposed on the top surface of the substrate and electrically connected to the bumps on the top surface of the substrate, and electro-optical paths to and from the one or more electronic components to the optical region via waveguides formed within the substrate.

7. The method of claim 1, wherein, prior to grinding down the top surface of the overmold, the top portion of the sacrificial cap has a thickness of greater than 25 microns.

8. The method of claim 1, wherein a thickness between a top and bottom surface of the sacrificial cap prior to grinding down the top surface of the overmold is less than 1000 microns.

9. The method of claim 1, wherein the sacrificial cap being positioned over the top surface of the substrate covering the optical region prevents the overmold from flowing between the sacrificial cap and the substrate.

10. The method of claim 1, wherein the sacrificial cap and the overmold that is deposited over the substrate are made from a same material.

11. The method of claim 1, wherein the sacrificial cap and the overmold that is deposited over the substrate are made from different materials.

12. The method of claim 1, wherein the substrate is a wafer.

13. The method of claim 1, wherein the sacrificial cap includes one or more openings between an exterior of the sacrificial cap and the recess, the one or more openings being configured to allow gas to escape from the recess under thermal expansion of the sacrificial cap.

14. The method of claim 13, wherein the one or more openings are sized to allow gas to escape from the recess without allowing the overmold to penetrate the one or more openings and flow into the recess.

15. A method for packaging an electro-photonic circuit, comprising:
obtaining a photonic integrated circuit (PIC) wafer comprising:
an optical region near a top surface of the PIC wafer configured to allow light to enter and exit the PIC wafer; and
optical transmitter and receiver portions in optical communication with the optical region, the optical transmitter and receiver portions having electrical interconnects to the top surface of the PIC wafer in a portion that does not extend into the optical region;
positioning a sacrificial cap over the top surface of the PIC wafer covering the optical region, wherein the sacrificial cap includes a top portion and a recess formed therein under the top portion, and wherein the recess is positioned over the optical region when the sacrificial cap is positioned over the top surface of the PIC wafer;
depositing an overmold over the PIC wafer and over the sacrificial cap; and
grinding down a top surface of the overmold, wherein grinding down the top surface of the overmold includes grinding the top portion of the sacrificial cap to expose the recess, wherein the recess provides a void over a substantial portion of the optical region prior to grinding.

16. The method of claim 15, wherein exposing the recess exposes an optical path to the optical region.

17. The method of claim 15, further comprising coupling a plurality of optical fibers to the optical region using an optical interface component.

18. The method of claim 17, wherein the optical interface component is a fiber array unit (FAU).

19. The method of claim 15, wherein:
the PIC wafer comprises bumps on the top surface of the PIC wafer and waveguides formed within the PIC wafer; and
the method further comprises disposing one or more electronic components on the PIC wafer, wherein disposing the one or more electronic components on the PIC wafer comprises connecting electrical contacts of the one or more electronic components to the bumps on the top surface of the PIC wafer and forming electro-optical paths to and from the one or more electronic components to the optical region via the waveguides formed within the PIC wafer.

20. The method of claim 15, wherein obtaining the PIC wafer comprises obtaining a PIC wafer comprising bumps on the top surface of the PIC wafer, waveguides formed within the PIC wafer, one or more electronic components disposed on the top surface of the PIC wafer and electrically connected to the bumps on the top surface of the PIC wafer, and electro-optical paths to and from the one or more electronic components to the optical region via waveguides formed within the PIC wafer.

21. The method of claim 15, wherein, prior to grinding down the top surface of the overmold, the top portion of the sacrificial cap has a thickness of greater than 25 microns.

22. The method of claim 15, wherein a thickness between a top and bottom surface of the sacrificial cap prior to grinding down the top surface of the overmold is less than 1000 microns.

23. The method of claim 15, wherein positioning the sacrificial cap over the top surface of the PIC wafer covering the optical region prevents the overmold from flowing between the sacrificial cap and the PIC wafer.

24. The method of claim 15, wherein the sacrificial cap is made from a same overmolding material as the overmold that is deposited over the PIC wafer.

25. The method of claim 15, wherein the sacrificial cap is made from a different overmolding material as the overmold that is deposited over the PIC wafer.

26. The method of claim 15, wherein the sacrificial cap includes one or more openings between an exterior of the sacrificial cap and the recess, the one or more openings being configured to allow gas to escape from the recess under thermal expansion of the sacrificial cap.

27. The method of claim 26, wherein the one or more openings are sized to allow gas to escape from the recess without allowing the overmold to penetrate the one or more openings and flow into the recess.

* * * * *